United States Patent
Brambilla et al.

(10) Patent No.: US 11,888,397 B2
(45) Date of Patent: Jan. 30, 2024

(54) DRIVER CIRCUIT FOR SWITCHING CONVERTERS

(71) Applicant: STMicroelectronics S.r.l., Agrate Brianza (IT)

(72) Inventors: Niccolo' Brambilla, Cassina de' Pecchi (FR); Sandro Rossi, Pavia (IT); Valeria Bottarel, Novara (IT)

(73) Assignee: STMicroelectron S.r.l., Agrate Brianza (IT)

( * ) Notice: Subject to any disclaimer, the term of this patent is extended or adjusted under 35 U.S.C. 154(b) by 161 days.

(21) Appl. No.: 17/531,024

(22) Filed: Nov. 19, 2021

(65) Prior Publication Data

US 2022/0166319 A1 May 26, 2022

(30) Foreign Application Priority Data

Nov. 24, 2020 (IT) .......................... 102020000028121

(51) Int. Cl.
*H02M 3/158* (2006.01)
*H02M 1/00* (2006.01)

(52) U.S. Cl.
CPC ......... *H02M 3/158* (2013.01); *H02M 1/0009* (2021.05)

(58) Field of Classification Search
CPC ..... H02M 3/158; H02M 1/0009; H02M 3/156
See application file for complete search history.

(56) References Cited

U.S. PATENT DOCUMENTS

| | | | |
|---|---|---|---|
| 9,929,653 B1 | 3/2018 | Mercer et al. | |
| 10,511,291 B1 | 12/2019 | Kandah et al. | |
| 2016/0254757 A1* | 9/2016 | Dai | H02M 3/33573 363/17 |
| 2017/0207707 A1* | 7/2017 | Dai | H02M 3/3372 |
| 2017/0294839 A1* | 10/2017 | de Cremoux | H02M 3/157 |
| 2019/0238129 A1 | 8/2019 | Fukushima et al. | |
| 2019/0386557 A1 | 12/2019 | Wang et al. | |

FOREIGN PATENT DOCUMENTS

EP    3512083 A1    7/2019

OTHER PUBLICATIONS

IT Search Report and Written Opinion for priority appl (IT Appl. No. 102020000028121), report dated Jul. 9, 2021 (8 pages).

* cited by examiner

*Primary Examiner* — Jue Zhang
*Assistant Examiner* — Afework S Demisse
(74) *Attorney, Agent, or Firm* — Crowe & Dunlevy

(57) ABSTRACT

A DC-DC switching converter includes power switches selectively coupling an output terminal with a first voltage or with a second voltage. A driver stage is coupled with the power switches for driving the power switches. A driver control stage is coupled with the driver stage for controlling the operation of the driver stage. An output current sensing circuit is coupled with the output terminal and with the driver control stage, and is configured to sense a sign of an output current delivered by the DC-DC switching converter at the output terminal and to generate control signals for the driver control stage. The driver control stage controls the operation of the driver stage according to states of the control signals received from the output current sensing circuit, for selectively delaying the activation of the power switches depending on the sensed sign of the output current.

14 Claims, 17 Drawing Sheets

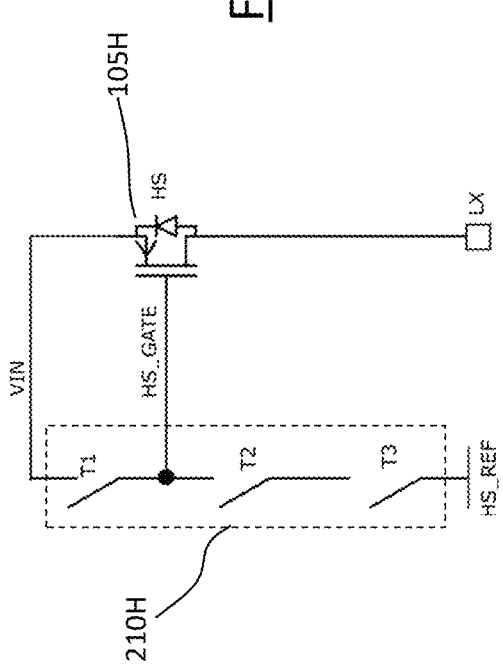
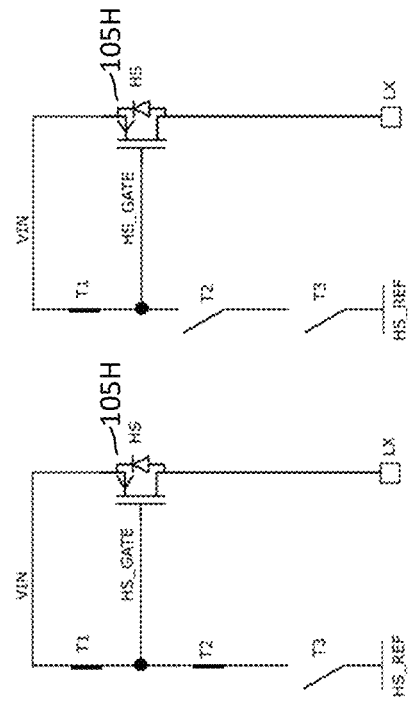
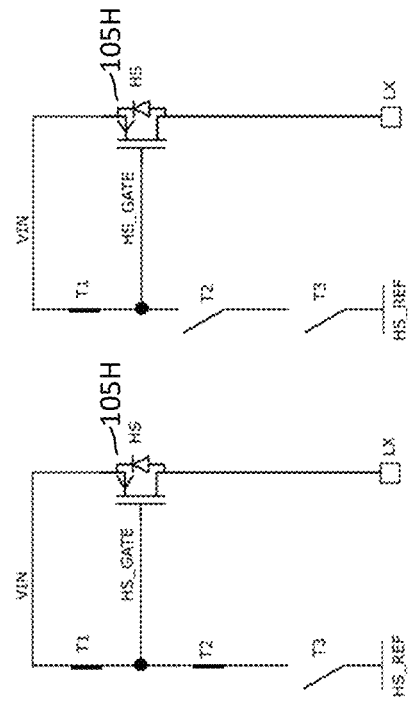
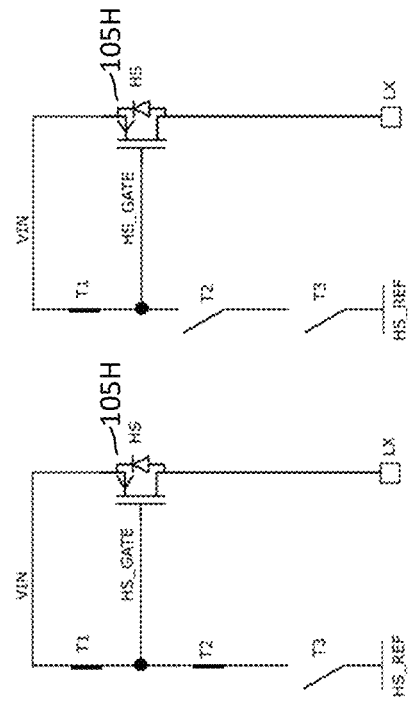
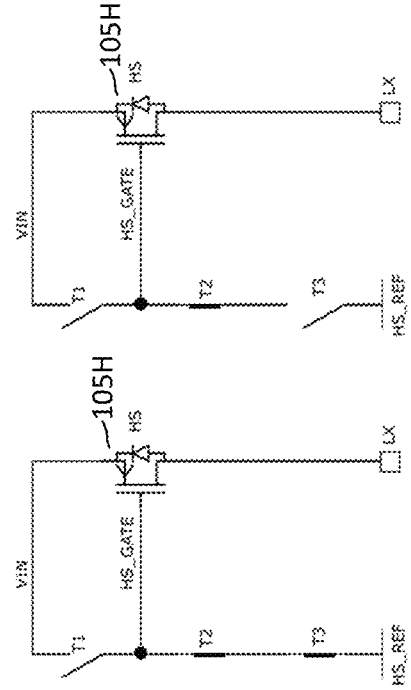

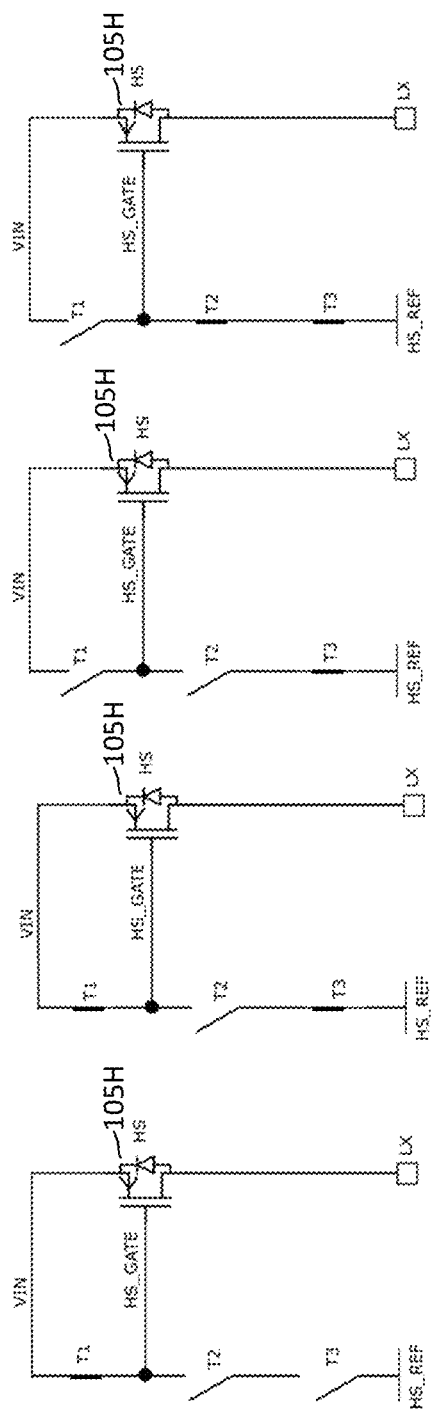

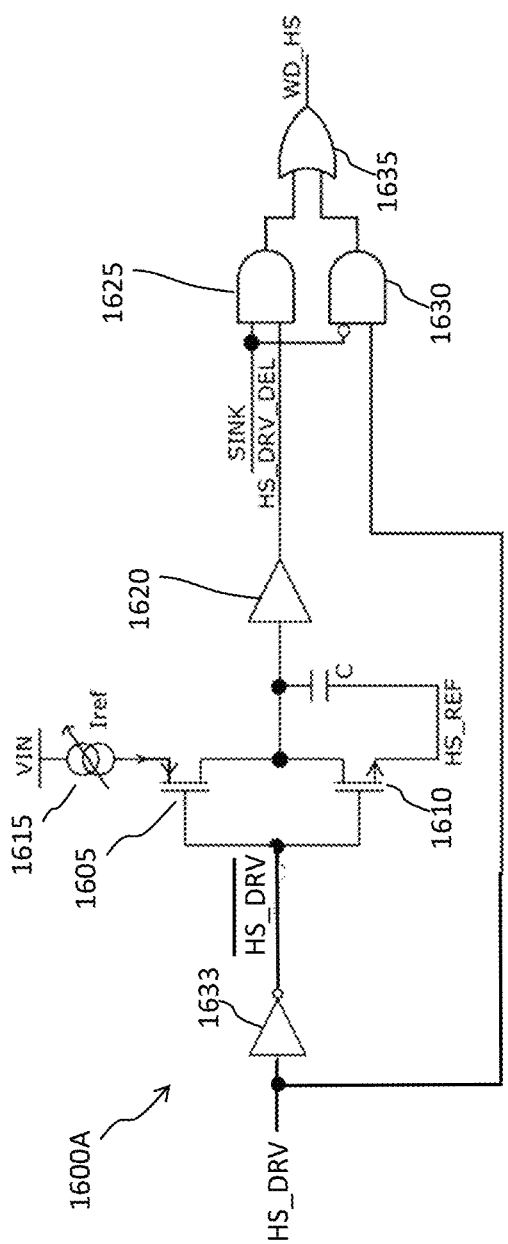
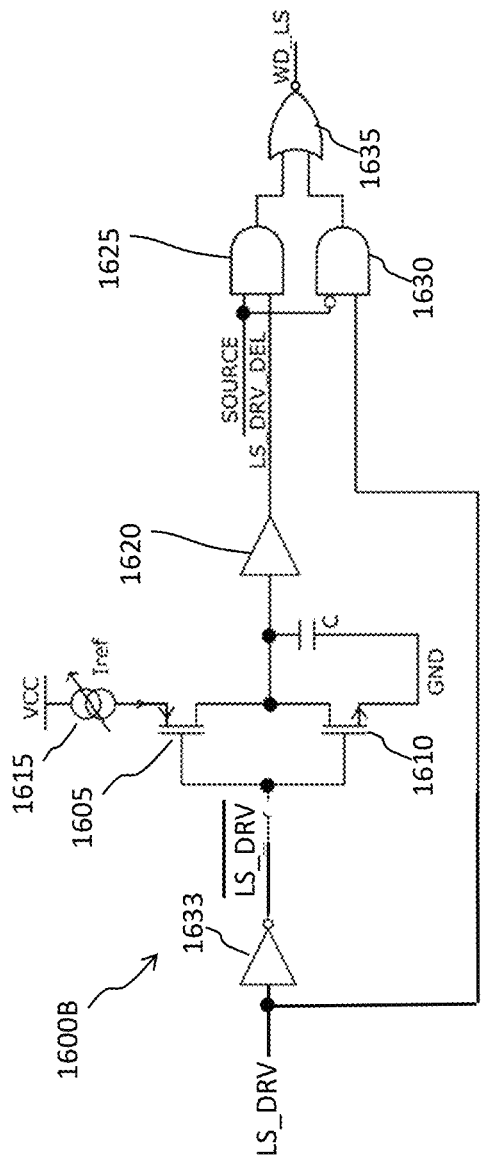

DRIVER CIRCUIT FOR SWITCHING CONVERTERS

PRIORITY CLAIM

This application claims the priority benefit of Italian Application for Patent No. 102020000028121, filed on Nov. 24, 2020, the content of which is hereby incorporated by reference in its entirety to the maximum extent allowable by law.

TECHNICAL FIELD

The present disclosure generally relates to the field of switching converters. Particularly, the present disclosure relates to DC-DC switching converters, which are types of electronic power converters used for converting a direct current (DC) input voltage into a direct current (DC) output voltage of value generally different from the DC input voltage value, i.e., for converting a DC power source from one voltage level to another.

BACKGROUND

DC-DC switching converters (also referred to as DC-DC power converters or DC-DC voltage regulators, and hereafter referred to as DC-DC converters) are a class of Switched-Mode Power Supply (SMPS) devices. DC-DC converters are often used in electronic systems comprising a DC power source (such as a battery) and one or more electronic/electro-mechanic components, each one operating at a respective voltage.

One type of DC-DC converter is a buck converter (or step-down converter), a DC-DC converter which steps down voltage (while stepping up current) from its input (supply) to its output (load).

DC-DC switching converters provide much greater power efficiency as DC-DC converters than linear regulators, which are simpler circuits that lower voltages by dissipating power as heat, but do not step up output current.

In the design of DC-DC converters, very high efficiency is of prominent importance. Driving stages of the final (power) switches (high side switch and low side switch) have to optimally provide a high amount of charge to power switches without significant impact on the overall DC-DC converter power losses. In a p-n bridge buck converter, this aspect is usually combined with the design of an auxiliary power supply to drive the high-side switch and must ensure the flexibility required by applications (e.g., in the industrial and automotive fields) in terms of input supply voltage.

The inefficiency of the driving stage of a DC-DC converter is usually related to different aspects, including: strength and speed of the driving stage, management of transitions between switching phases, and intrinsic static and dynamic power consumption of the driving stage.

Typical solutions define a fixed dead time between the on and off phases of the half bridge, usually 10 ns or longer, to avoid cross conduction.

Signal level shifting from a low voltage domain to a high voltage domain is usually done by resistive or crossed level shifters.

Sink and source operation modes of the DC-DC converter (corresponding to negative or positive DC-DC converter output current) imply the activation of the high side switch and low side switch intrinsic diodes, respectively. Typical solutions define a minimum fixed time (watchdog time) after which the switching phase must be changed to avoid intrinsic diode conduction losses as much as possible.

It is noted that the typical solutions mentioned above are not satisfactory, being affected by drawbacks.

For example, the provision of a fixed dead time between the on and off phases of the half bridge to avoid cross conduction can lead to an increase of intrinsic diode conduction losses on the half bridge due to inefficient transition between switching phases.

Also, the use of resistive and crossed level shifters implies a non-negligible static and dynamic power consumption and propagation delay, especially at high input voltages.

Moreover, relying on a minimum fixed time (watchdog time) implies an inefficient management of the turn-on of both switches in source/sink mode operation and therefore a lower efficiency.

SUMMARY

According to an aspect of the present disclosure, a DC-DC switching converter is provided. The DC-DC switching converter includes power switches operable for selectively coupling an output terminal of the DC-DC switching converter with a first voltage or with a second voltage, the output terminal being intended to be coupled to a load when the DC-DC switching converter is in use.

A driver stage is coupled with the power switches for driving the power switches. A driver control stage is coupled with the driver stage for controlling the operation of the driver stage.

An output current sensing circuit is coupled with the output terminal of the DC-DC switching converter and with the driver control stage, and is configured to sense a sign of an output current delivered by the DC-DC switching converter at the output terminal and to generate control signals for the driver control stage.

The driver control stage controls the operation of the driver stage according to states of the control signals received from the output current sensing circuit, for selectively delaying (or not) the activation of the power switches depending on the sensed sign of the output current.

Another aspect of the present disclosure relates to an electronic system including at least one DC-DC converter according to the previous aspect.

A further aspect of the present disclosure relates to a method of operating a DC-DC switching converter having power switches operable for selectively coupling an output terminal of the DC-DC switching converter, intended to be coupled to a load, with a first voltage or with a second voltage. The method includes sensing a sign of an output current of the DC-DC switching converter, the output current being delivered by the DC-DC switching converter to the load, and selectively delaying (or not) the activation of the power switches depending on the sensed sign of the output current.

The technology disclosed herein uses a simple and fast internal anti-cross conduction mechanism without the definition of a fixed dead time by the control logic controlling the drivers of the final (power) switches.

Advantageously, an anti cross-conduction scheme is also applied on the last stage of the drivers for the power switches, to improve efficiency.

The use of capacitive level shifters allows fast transitions and lower power consumption.

The provision of a circuit for detecting the polarity (sign) of the DC-DC converter output current allows finely adjusting the intervention of the power switches to optimize power loss on intrinsic diodes.

BRIEF DESCRIPTION OF THE DRAWINGS

The above features and advantages of the present disclosure, as well as additional features and advantages, will be made apparent by the following detailed description of exemplary embodiments thereof. For its better intelligibility, the following description should be read making reference to the annexed figures, wherein:

FIGS. 4 and 5A-5D schematize the anti-cross conduction management of the driver of the high side switch of the DC-DC converter, when turning the high side switch off;

FIGS. 6A-6D schematize the anti-cross conduction management of the driver of the high side switch of the DC-DC converter, when turning the high side switch on;

FIGS. 16A and 16B show possible circuit implementations of the watchdog management for the driver of the high side switch and for the driver of the low side switch, respectively.

DETAILED DESCRIPTION

Figure 1A:
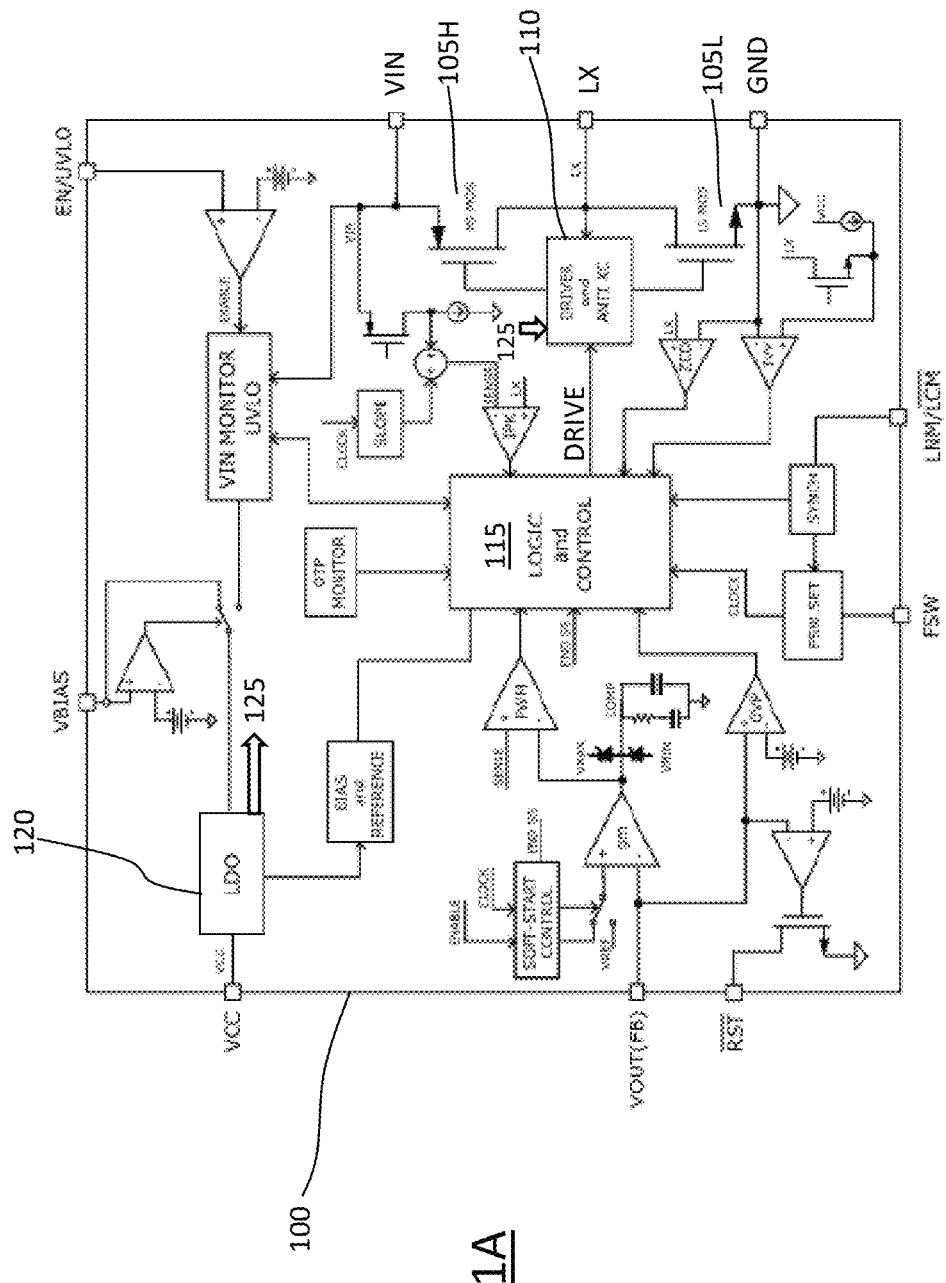
FIG. 1A is a functional block diagram of a DC-DC converter in which an approach according to an embodiment of the present disclosure is implemented.

FIG. 1A is a functional block diagram of a DC-DC converter in which an approach according to an embodiment of the present disclosure is implemented. In particular, the DC-DC converter depicted in FIG. 1A is a step-down switching regulator, particularly a buck converter.

Without entering into excessive details not relevant for the understanding, the DC-DC converter of FIG. 1A, globally denoted as 100, has a power section that comprises a high side switch 105H and a low side switch 105L connected in series between a DC input voltage VIN and a DC reference voltage GND (power ground), which are externally supplied to the DC-DC converter 100. In an embodiment, the high side switch 105H comprises a p-MOS transistor (p-MOSFET) and the low side switch 105L comprises an n-MOS transistor (n-MOSFET), this circuitry referred to in the art as a p-n (half) bridge circuit. The p-MOSFET and the n-MOSFET are power MOSFETs, e.g., DMOS. The source terminal of the p-MOSFET 105H is coupled to the input voltage VIN, the drain terminal of the p-MOSFET 105H is coupled to the drain terminal of the n-MOSFET 105L, and the source terminal of the n-MOSFET 105L is coupled to the reference voltage GND. The drain terminal of the p-MOSFET 105H and the drain terminal of the n-MOSFET 105L are coupled to an output terminal or switching terminal LX of the DC-DC converter 100 (to which a load—not shown in the figure, can be connected).

The gate terminals of the p-MOSFET 105H and the n-MOSFET 105L are controlled by a driver circuit 110, which, according to an embodiment here disclosed, also includes an anti-cross conduction circuit, as will described in detail herein. In an embodiment, the driver circuit 110 is also coupled to the output terminal LX of the DC-DC converter 100, for sensing a polarity of the output current of the DC-DC converter 100 (i.e., the current delivered to, or sunk from, a load connected to the output terminal LX).

The operation of the driver circuit 110 is governed by a control logic 115. The control logic 115 generates a drive signal (control signal) DRIVE controlling the driver circuit 110. In operation, the drive signal DRIVE can be a square wave signal with a certain duty cycle. A polarity of the voltage at the output terminal LX reproduces the polarity of the drive signal DRIVE (i.e., when signal DRIVE goes high, the logic level at the output terminal LX shall go high, and when signal DRIVE goes low, the logic level at the output terminal LX shall go low).

A reference voltage generator 120 generates internal reference voltages 125 for the driver circuit 110, as discussed later on.

Other functional blocks and components shown in FIG. 1A are not relevant for understanding and will not be presented.

Figure 1B:
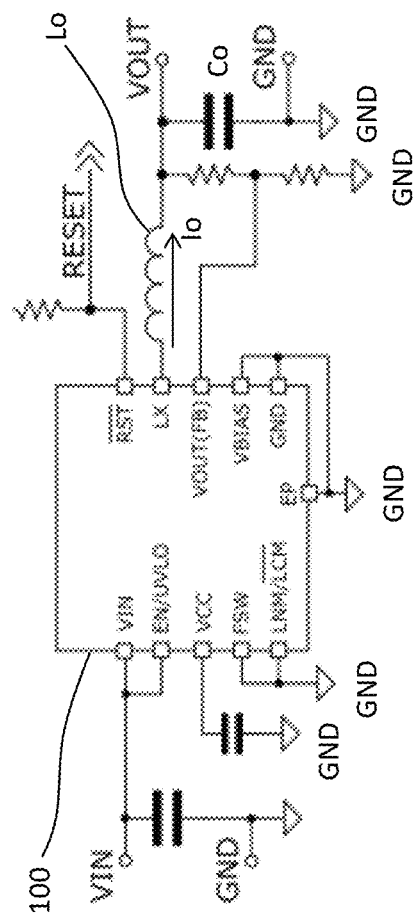
FIG. 1B shows a possible use of the DC-DC converter of FIG. 1A.

FIG. 1B shows a possible use of the DC-DC converter of FIG. 1A as a step-down voltage regulator or buck converter. Without entering into excessive details, the output terminal LX of the DC-DC converter 100 is coupled to one terminal of an output inductor Lo whose other terminal is coupled to one plate of an output capacitor Co, whose other plate is coupled to the reference voltage GND. Reference Io indicates the output current of the DC-DC converter (the arrow indicates the adopted convention: the output current Io is positive when the DC-DC converter delivers current to a load, while the output current Io is negative when the DC-DC converter sinks current from a load).

Figure 2:
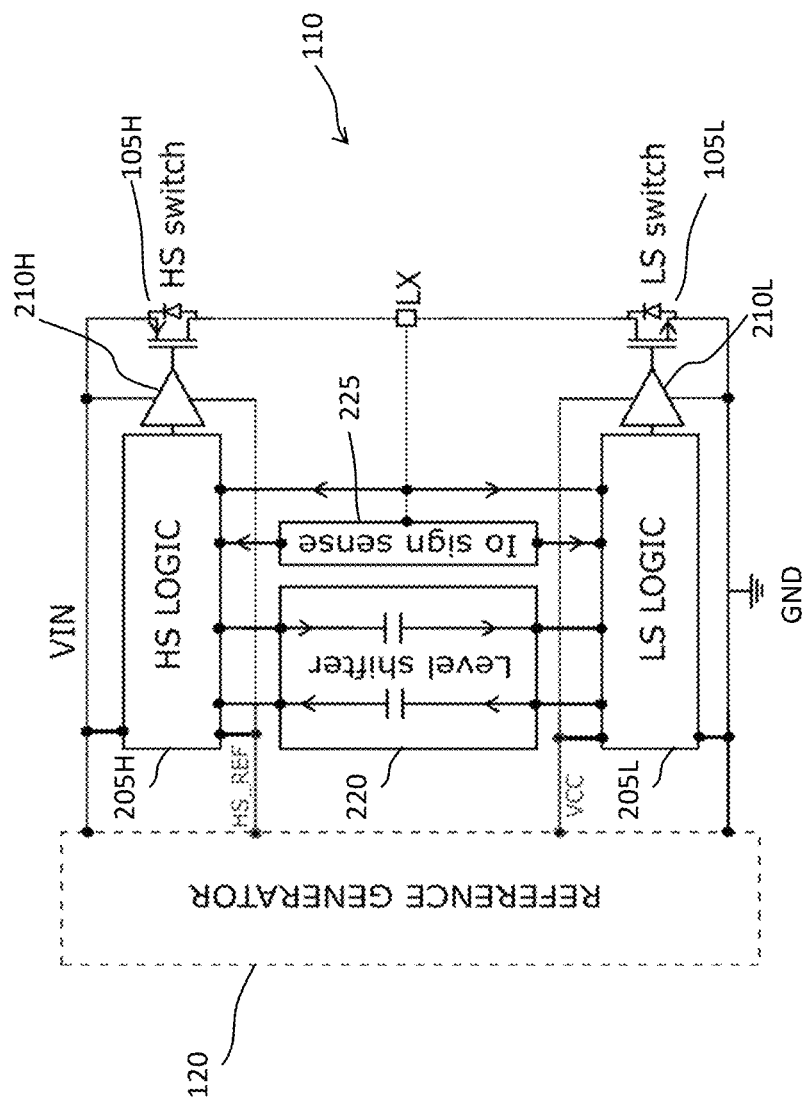
FIG. 2 schematically shows, in terms of functional blocks, a driver circuit according to an embodiment of the present disclosure for driving final switches of the DC-DC converter.

FIG. 2 schematically shows, in terms of functional blocks, a driver circuit 110 according to an embodiment of the present disclosure. In this figure, the p-MOSFET of the high side switch 105H and the n-MOSFET of the low side switch 105L are depicted with their respective intrinsic diodes across the source and drain terminals.

The driver circuit 110 comprises a high side driver logic circuit 205H for controlling the high side switch 105H. The driver circuit 110 comprises a low side driver logic circuit 205L for controlling the low side switch 105L. The high side driver logic circuit 205H generates a control signal for the high side switch 105H which is fed to the gate terminal of the p-MOSFET 105H via a high side driver 210H. The low side driver logic circuit 205L generates a control signal for the low side switch 105L which is fed to the gate terminal of the n-MOSFET 105L via a low side driver 210L.

The driver circuit 110 receives from the reference voltage generator 120 a first internal reference voltage HS_REF for the high side driver logic circuit 205H and associated high side driver 210H, and a second internal reference voltage VCC for the low side driver logic circuit 205L and associated low side driver 210L. The high side driver logic circuit 205H and the associated high side driver 201H also receive the input voltage VIN. The low side driver logic circuit 205L and the associated low side driver 210L also receive the reference voltage GND.

The driver circuit 110 comprises a level shifter 220 for shifting voltage levels of signals from the domain of the low side driver logic circuit 205L to the domain of the high side driver logic circuit 205H, and vice versa.

The driver circuit 110 further comprises a circuit 225 coupled to the DC-DC converter output terminal LX for sensing a polarity of the output current of the DC-DC converter (i.e., the current delivered to, or sunk from, a load connected to the output terminal LX). The current polarity sensing circuit 225 provides sensing signals to the high side driver logic circuit 205H and to the low side driver logic circuit 205L.

Figure 3:
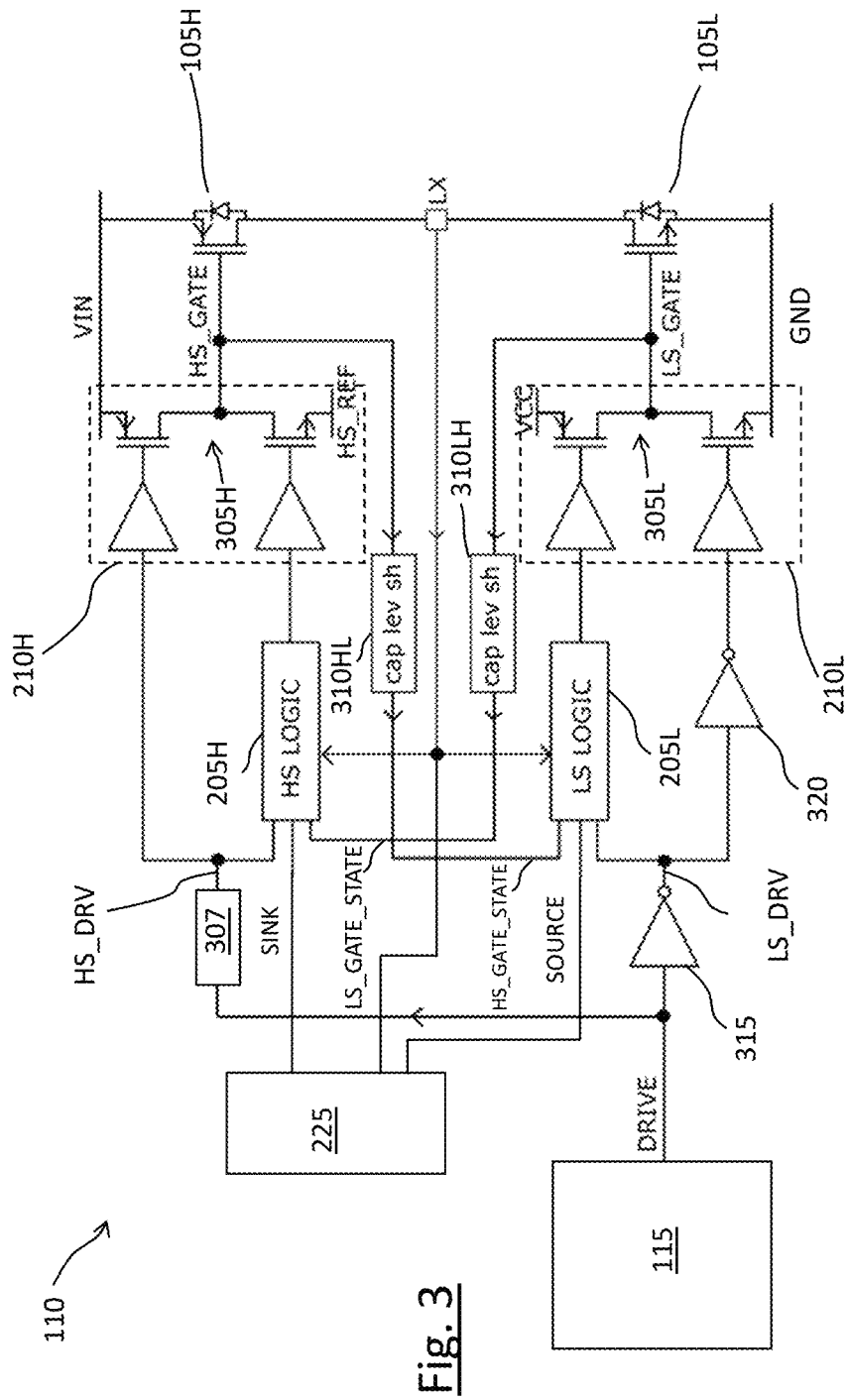
FIG. 3 shows in greater detail the driver circuit of FIG. 2.

FIG. 3 shows in greater detail the driver circuit of FIG. 2. The high side driver 210H driving the gate electrode of the high side p-MOSFET 105H (signal HS_GATE) and the low side driver 210L driving the gate electrode of the low side n-MOSFET 105L (signal LS_GATE) are schematized as comprising respective CMOS inverters 305H and 305L. The CMOS inverter 305H of the high side driver 210H is supplied by the input voltage VIN and the first internal reference voltage HS_REF. The CMOS inverter 305L of the low side driver 210L is supplied by the second internal reference voltage VCC and the reference voltage GND of the DC-DC converter 100. In the high side driver 201H, the gate electrode of the p-MOSFET of the CMOS inverter 305H is controlled (through a buffer) by a high side drive control signal HS_DRV being a voltage level shifted version (level shifter 307) of the signal DRIVE generated by the control logic 115. The gate electrode of the n-MOSFET of the CMOS inverter 305H is controlled (through a buffer) by a control signal generated by the high side driver logic circuit 205H. In the low side driver 210L, the gate electrode of the n-MOSFET of the CMOS inverter 305L is controlled (through a buffer) by a logic complement (inverter 320) of a low side drive control signal LS_DRV being the binary logic complement (inverter 315) of the control signal DRIVE generated by the control logic 115. The gate electrode of the p-MOSFET of the CMOS inverter 305L is controlled (through a buffer) by a control signal generated by the low side driver logic circuit 205L.

The high side driver logic circuit 205H receives the control signal HS_DRV, a control logic signal SINK generated by the output current polarity sensing circuit 225, and a voltage level shifted version LS_GATE STATE of the signal LS_GATE driving the gate electrode of the low side n-MOSFET 105L, with voltage level shifted by a level shift circuit 310LH part of the level shifter 220 of FIG. 2.

The low side driver logic circuit 205L receives the control signal LS_DRV (output of inverter 315, receiving in input the control signal DRIVE), a control logic signal SOURCE generated by the output current polarity sensing circuit 225, and a voltage level shifted version HS_GATE STATE of the signal HS_GATE driving the gate electrode of the high side p-MOSFET 105H, with voltage level shifted by a level shift circuit 310HL part of the level shifter 220 of FIG. 2.

Later on, an exemplary output current polarity sensing circuit 225 and the way the control logic signals SINK and SOURCE are generated will be described.

The high side driver logic circuit 205H and the low side driver logic circuit 205L are also coupled to the output terminal LX of the DC-DC converter 100.

FIGS. 4, 5A-5D, and 6A-6D schematize the management of anti-cross conduction through the high side switch 105H and low side switch 105L. The high side driver 210H is considered, however similar considerations apply, mutatis mutandis, to the low side driver 210L, which is the dual of the high side driver 205H.

Referring first to FIG. 4, reference T1 denotes a switch corresponding to the p-MOSFET of the CMOS inverter 305H of the high side driver 201H. Reference T3 denotes a switch corresponding to the n-MOSFET of the CMOS inverter 305H. Reference T2 denotes a switch not shown in the high side driver 210H depicted in FIG. 3 (the high side driver 201H and the low side driver 201L depicted in FIG. 3 are deliberately over-simplified).

Switches T1 and T3 define the conditions of turn-on and turn-off of the high side p-MOSFET 105H. Switch T2 allows a three-state condition on the last stage of the high-side driver 210 to avoid cross-conduction.

FIGS. 5A-5D schematize four phases of a procedure for switching off the high side p-MOSFET 105H, starting from a condition of the switches T1, T2 and T3 when the high side p-MOSFET 105H is on, as depicted in FIG. 5A (phase 1). In this condition, switch T1 is open (not conductive) whereas switches T2 and T3 are closed (conductive). Signal HS_GATE driving the gate electrode of the high side p-MOSFET 105H is pulled down to the first internal reference voltage HS_REF (so that the high side p-MOSFET 105H is on).

In phase 2 (FIG. 5B), while switch T1 is kept open (not conductive), switch T3 is opened (not conductive). The gate electrode of the high side p-MOSFET 105H is thereby left floating (signal HS_GATE line is brought to a high impedance condition).

In phase 3 (FIG. 5C), switch T1 is closed (conductive) while switch T3 is kept open (not conductive). Signal HS_GATE driving the gate electrode of the high side p-MOSFET 105H is pulled up to the input voltage VIN (so that the high side p-MOSFET 105H is turned off).

In phase 4 (FIG. 5D) switch T2 is opened (not conductive), while switch T1 is kept closed and switch T3 is kept open. Signal HS_GATE driving the gate electrode of the high side p-MOSFET 105H is kept at the input voltage VIN (so that the high side p-MOSFET 105H is kept turned off).

FIGS. 6A-6D schematize four phases of a procedure for switching on the high side p-MOSFET 105H, starting from a condition of the switches T1, T2 and T3 when the high side p-MOSFET 105H is off, as depicted in FIG. 6A (phase 4), corresponding to FIG. 5D.

In phase 5 (FIG. 6B), switch T3 is closed (made conductive) while switch T2 is kept open and switch T1 is kept closed. Signal HS_GATE driving the gate terminal of the high side p-MOSFET 105H is kept at the input voltage VIN (so that the high side p-MOSFET 105H is kept turned off).

In phase 6 (FIG. 6C) switch T1 is opened, while switch T2 is kept open and switch T3 is kept closed. The gate electrode of the high side p-MOSFET 105H is left floating (signal HS_GATE line is brought to a high impedance condition).

In the next phase (FIG. 6D, corresponding to the return to phase 1 depicted in FIG. 5A), switch T2 is closed (made conductive). Signal HS_GATE driving the gate terminal of the high side p-MOSFET 105H is pulled down to the first internal reference voltage HS_REF (so that the high side p-MOSFET 105H is turned on).

The structure of the high side driver 210H shown and discussed in connection with FIGS. 4, 5A-5D and 6A-6D, particularly the presence of switch T2 and the described management of the opening/closing of switches T1, T2 and T3, allows, as mentioned in the foregoing, a tri-state condition of the high side driver 210H which advantageously prevents power losses due to cross-conduction in the switches of the high side driver 210H, which would cause a crowbar current to flow from the input voltage VIN to the first internal reference voltage HS_REF. By properly managing the closing/opening of switch T2, a (even temporary) situation in which all the switches T1, T2 and T3 are all conductive is avoided.

As to the timing of the closing of switch T2 in the turn on of the high side p-MOSFET 105H, switch T2 can be switched to the closed (conductive) state in several different conditions.

Switch T2 should be closed immediately or substantially immediately when, having the high side driver 210H of the high side switch 105H receiving the command (signal DRIVE from the control logic 115) for activating the high side switch 105H (signal HS_DRV asserted, causing switch T1 to open), and the output terminal LX of the DC-DC converter 100 being at a low voltage level ("low voltage level" meaning a voltage level equal or substantially equal to the reference voltage GND), output current Io is positive (meaning that the DC-DC converter 100 is operating in source mode). This determines a hard switching of the high side switch 105H (the p-MOSFET 105H is turned on when the voltage across its source and drain electrodes is approximately equal to VIN−GND).

Switch T2 should be closed immediately or substantially immediately when, having the high side driver 210H of the high side switch 105H receiving the command (signal DRIVE from the control logic 115) for activating the high side switch 105H (signal HS_DRV asserted, causing switch T1 to open), the voltage level at the output terminal LX of the DC-DC converter 100 has gone high ("high voltage level" meaning a voltage level equal or substantially equal to the input voltage VIN) due to negative output current Io (meaning that the DC-DC converter 100 is operating in sink mode). This determines a soft switching of the high side switch 105H (the p-MOSFET 105H is turned on when the voltage across its source and drain electrodes is approximately zero).

Switch T2 should be closed after a certain time (watchdog time) if, having the high side driver 210H of the high side switch 105H receiving the command (signal DRIVE from the control logic 115) for activating the high side switch 105H (signal HS_DRV asserted, causing switch T1 to open), the output current Io of the DC-DC converter 100 is negative (meaning that the DC-DC converter 100 is operating in sink mode) but the voltage level at the output terminal LX of the DC-DC converter 100 is not yet high, despite being rising. Closing switch T2 after the watchdog time ensures that a certain, limited time is left for the rising of the voltage at the output node LX, to limit power loss due to current flowing through the intrinsic diode of the p-MOSFET 105H.

These three conditions can be combined by splitting switch T2 into more than one switch, depending on the desired functionality, as for example depicted in FIG. 7 which will be described below.

Figure 7:
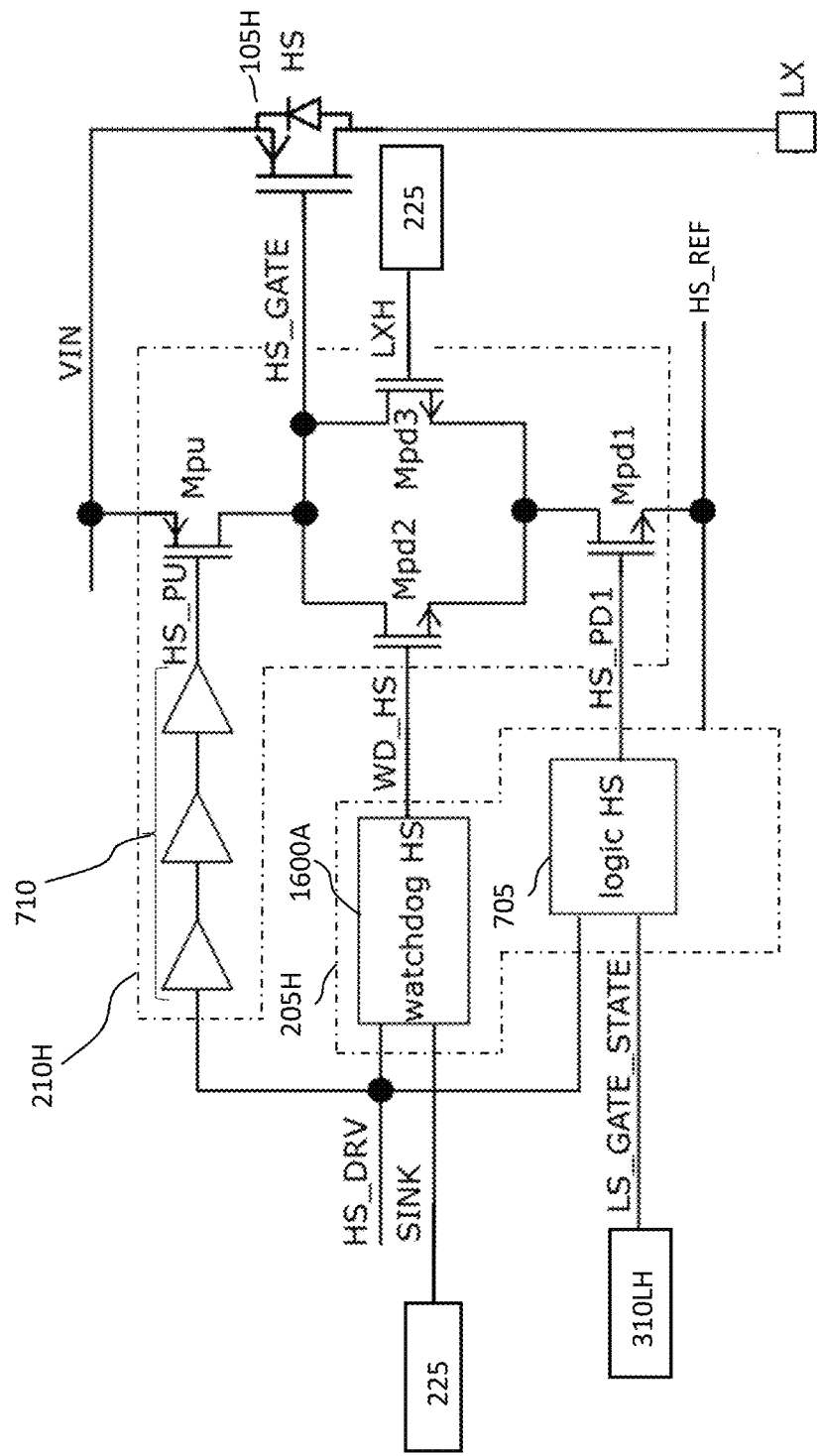
FIG. 7 depicts a possible circuit scheme for implementing the anti-cross conduction of the driver of the high side switch of the DC-DC converter.

FIG. 7 depicts a possible circuit scheme for implementing the anti-cross conduction of the high side driver 210H of the high side switch of the DC-DC converter.

The high side logic circuit 205H is shown in greater detail compared to FIG. 3. The high side logic circuit 205H comprises a high side watchdog circuit 1600A, for the high side driver of the high side switch 105H, receiving the control logic signal SINK generated by the output current polarity sensing circuit 225 and the high side drive control signal HS_DRV. An example of high side watchdog circuit 1600A will be described later on, in connection with FIG. 16A. The high side watchdog circuit 1600A generates a high side watchdog signal WD_HS for the high side driver of the high side switch 105H.

The high side logic circuit 205H further comprises a high side logic 705 that receives the signal LS_GATE STATE from the level shifter 310LH and the high side drive control signal HS_DRV. The high side logic 705 generates a signal HS_PD1.

FIG. 7 also shows the high side driver 210H in greater detail compared to FIG. 3, FIG. 4, FIGS. 5A-5D and FIGS. 6A-6D. The high side driver 210H comprises, on the high side (DC-DC converter input voltage VIN side), a p-MOSFET Mpu with a source electrode receiving the input voltage VIN. On the low side (first internal reference voltage HS_REF side), the high side driver 210H comprises an n-MOSFET Mpd1 with a source electrode receiving the first internal reference voltage HS_REF. The drain electrode of the p-MOSFET Mpu, from which the drive signal HS_GATE fed to the gate electrode of the high side p-MOSFET 105H is taken, and the drain electrode of the n-MOSFET Mpd1 are coupled to a shunt connection of two further n-MOSFETs Mpd2 and Mpd3 which have mutually coupled drain electrodes (coupled to the drain electrode of p-MOSFET Mpu) and mutually coupled source electrodes (coupled to the drain electrode of n-MOSFET Mpd1).

The gate electrode of p-MOSFET Mpu is driven by a signal HS_PU which is a delayed version of the high side drive control signal HS_DRV, delayed by a delay line 710. The gate electrode of n-MOSFET Mpd1 is driven by the signal HS_PD1 generated by the high side logic 705. The gate electrode of n-MOSFET Mpd2 is driven by the high side watchdog signal WD_HS. The gate electrode of n-MOSFET Mpd3 is driven by a signal LXH provided by the output current polarity sensing circuit 225 and that is related to the voltage at the output terminal LX of the DC-DC converter 100.

Making a comparison with FIG. 4, FIGS. 5A-5D, and FIGS. 6A-6D, p-MOSFET Mpu corresponds to switch T1, n-MOSFETs Mpd2 and Mpd3 in shunt connection correspond to switch T2, and n-MOSFET Mpd1 corresponds to switch T3.

p-MOSFET Mpu is driven by signal HS_DRV only, properly delayed.

The n-MOSFET Mpd1 is activated when the command to activate the high side switch 105H is received from the control logic 115 (signal HS_DRV asserted) and signal LS_GATE STATE (indicating the state of the signal LS_GATE that drives the gate electrode of the n-MOSFET 105L) is low.

The n-MOSFET Mpd2 is activated (even when signal LXH is low) when the signal HS_DRV is asserted, either immediately (when the DC-DC converter 100 is operating in source mode—signal SINK deasserted), or after a certain watchdog time (when the DC-DC converter 100 is operating in sink mode—signal SINK asserted).

The n-MOSFET Mpd3 is directly activated when signal LXH has already gone high (LXH='1') due to the operation of the DC-DC converter 100 in sink mode (output current Io<0). In this way, despite the DC-DC converter 100 is operating in sink mode, no watchdog time is waited for, because the voltage level at output node LX has already risen (in this case, even if n-MOSFET Mpd2 is still not on because the watchdog time has not yet elapsed and signal WD_HS is still deasserted, n-MOSFET Mpd3 bypasses n-MOSFET Mpd2).

It is pointed out that n-MOSFETs Mpd2 and Mpd3 are not activated in a mutually exclusive manner. Depending on the circumstances, either one or the other of n-MOSFETs Mpd2 and Mpd3 turns on before (and the other n-MOSFET turns on after), but at the end both n-MOSFETs Mpd2 and Mpd3 are turned on.

Figure 8:
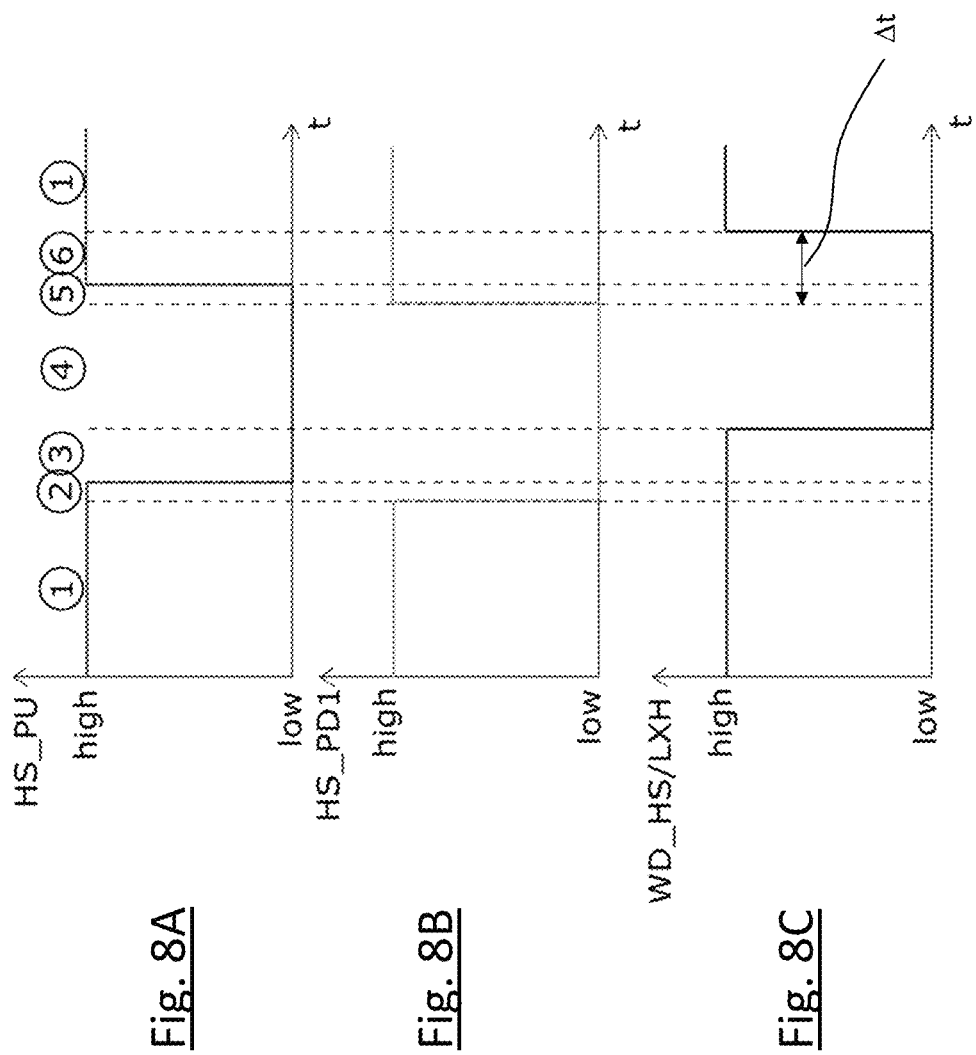
FIGS. 8A-8C shows waveforms of three signals in the circuit of FIG. 7.

FIGS. 8A-8C show waveforms of three signals in the circuit of FIG. 7, namely signal HS_PU, driving p-MOSFET Mpu, signal HS_PD1, driving n-MOSFET Mpd1, and the watchdog signal WD_HS or signal LXH. Numbers within circles denote the operating phases 1 to 6 described in connection with FIGS. 5A-5D and FIGS. 6A-6D. The transition from low to high of the signal WS_HS occurs with a delay Δt with respect to the transition from low to high of the signal HS_PU; such a delay can be the watchdog time or (in case no watchdog time is waited for) a prescribed delay for avoiding cross conduction through the MOSFETs of the high side driver 210H.

The delay introduced by delay line 710 helps ensure that the transition of signal HS_PU happens always later than the transition of signal HS_PD1, to avoid cross-conduction through the MOSFETs of the high side driver 210H.

Figure 9:
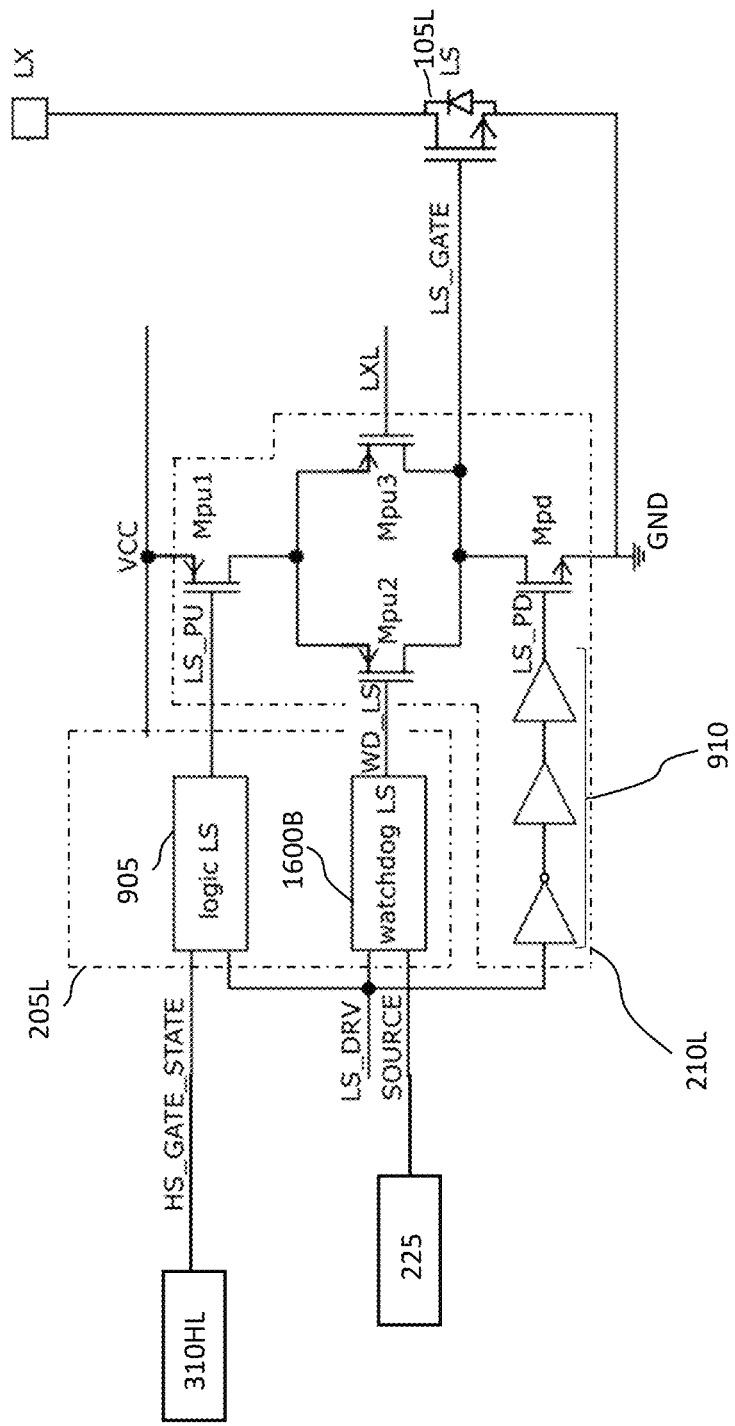
FIG. 9 depicts a possible circuit scheme for implementing the anti-cross conduction of the driver of the low side switch of the DC-DC converter.

FIG. 9 depicts a possible circuit scheme for implementing the anti-cross conduction of the driver of the low side switch of the DC-DC converter. The circuit of FIG. 9 is the dual of the circuit of FIG. 7. Same reference numerals are used for denoting elements functionally corresponding to those of the circuit of FIG. 7.

The low side logic circuit 205L is shown in greater detail compared to FIG. 3. The low side logic circuit 205L comprises a low side watchdog circuit 1600B, for the low side driver of the low side switch 105L, receiving a logic signal SOURCE generated by the output current polarity sensing circuit 225 and the drive control signal LS_DRV. An example of low side watchdog circuit 1600B will be described herein, in connection with FIG. 16B. The low side watchdog circuit 1600B generates a low side watchdog signal WD_LS for the low side driver of the low side switch 105L.

The low side logic circuit 205L further comprises a low side logic 905 that receives the signal HS_GATE STATE from the level shifter 310HL and the drive control signal LS_DRV. The low side logic 905 generates a signal LS_PU.

FIG. 9 also shows the low side driver 210L in greater detail compared to FIG. 3. The low side driver 210L comprises, on the high side (second internal reference voltage VCC side), a p-MOSFET Mpu1 with source electrode receiving the first internal reference voltage VCC. On the low side (reference voltage GND side), the buffer 210L comprises an n-MOSFET Mpd with a source electrode receiving the reference voltage GND. The drain electrode of the p-MOSFET Mpu1 and the drain electrode of the n-MOSFET Mpd are coupled to a shunt connection of two further p-MOSFETs Mpu2 and Mpu3, which have mutually coupled source electrodes (coupled to the drain electrode of p-MOSFET Mpu1) and mutually coupled drain electrodes (coupled to the drain electrode of n-MOSFET Mpd). The drive signal LS_GATE fed to the gate electrode of the low side n-MOSFET 105L is taken from the drain electrode of n-MOSFET Mpd.

The gate electrode of n-MOSFET Mpd is driven by a signal LS_PD which is a delayed and logically complemented version of the drive control signal LS_DRV, delayed and logically inverted by an inverting delay line 910. The gate electrode of p-MOSFET Mpu1 is driven by the signal LS_PD generated by the low side logic 905. The gate electrode of p-MOSFET Mpu2 is driven by the low side watchdog signal WD_LS. The gate electrode of p-MOSFET Mpu3 is driven by a signal LXL that is provided by the output current polarity sensing circuit 225 and that is related to the voltage at the output terminal LX of the DC-DC converter 100.

The n-MOSFET Mpd is driven by the signal LS_DRV (logically complemented and delayed) only, properly delayed.

The p-MOSFET Mpu1 is activated when signal LS_DRV is asserted (indicating that the control logic has commanded the activation of the low side switch 105L) and signal HS_GATE STATE (indicating the state of the signal HS_GATE driving the gate electrode of the p-MOSFET 105H) is high (indicating that the high side switch 105H is open).

The p-MOSFET Mpu2 is activated (even when signal LXL is high) when the signal LS_DRV is asserted, either immediately (when the DC-DC converter 100 is operating in sink mode—signal SOURCE deasserted), or after a certain watchdog time (when the DC-DC converter 100 is operating in source mode—signal SOURCE asserted).

The p-MOSFET Mpu3 is directly activated when signal LXL is low (LXL='0') due to the operation of the DC-DC converter 100 in source mode (output current Io>0). p-MOSFET Mpu3 turns on before p-MOSFET Mpu2 if the voltage level at the output terminal LX falls in a time shorter than the watchdog time (In source mode the voltage level at the output terminal LX falls due to the DC-DC converter output load and the speed of the fall depends on the output load value. The fall time of the voltage level at the output terminal LX determines which p-MOSFET, among p-MOSFET Mpu2 and p-MOSFET Mpu3, turns on before: p-MOSFET Mpu2 in case the output load is of small value and thus the watchdog time is waited for, or p-MOSFET Mpu3 in case the value of the output load is greater and the fall of the voltage level at the output terminal LX is relatively fast, taking a time shorter than the watchdog time).

It is pointed out that p-MOSFETs Mpu2 and Mpu3 are not activated in a mutually exclusive manner. Depending on the circumstances, either one or the other of p-MOSFETs Mud2 and Mpu3 turns on before (and the other p-MOSFET turns on after), but at the end both p-MOSFETs Mpu2 and Mpu3 are turned on.

Figure 10:
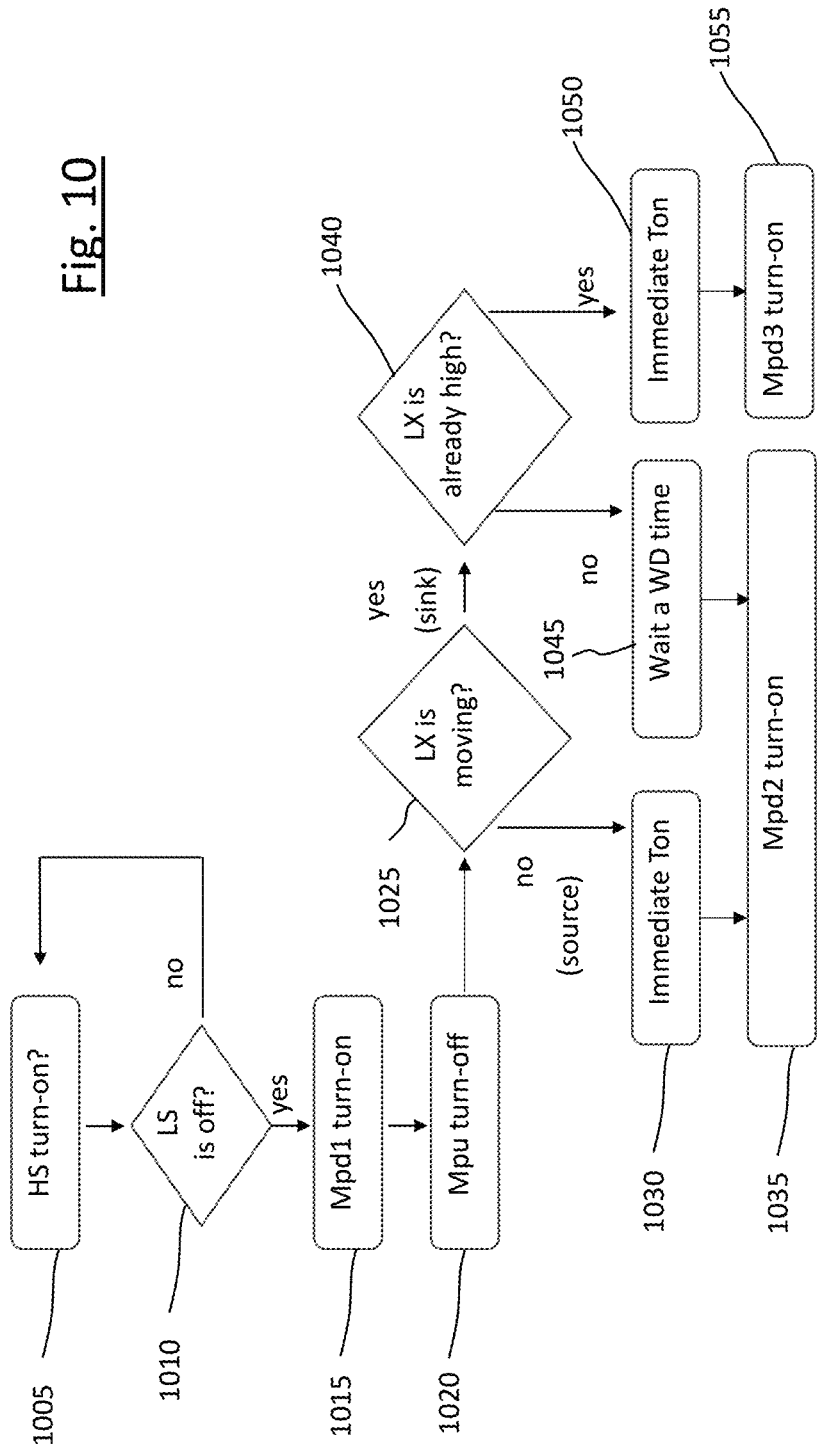
FIG. 10 is a flowchart describing the operation of the circuit of FIG. 7, in the turn-on procedure of the high side switch.

FIG. 10 is a flowchart describing the operation of the circuit of FIG. 7, in the turn-on procedure (procedure of turning on of the high side switch 105H).

Block 1005 indicates that the circuit of FIG. 7 remains in a wait condition until the receival (from the control logic 115) of the command (signal HS DRIVE switching high) to turn the high side switch 105H on (making it conductive). When the command is received, the circuit checks (block 1010) if the low side switch 105L is off (not conductive), by checking the state of signal LS_GATE STATE. If the low side switch 105L is not off (exit branch no of block 1010), i.e., it is still conductive, the circuit operation returns to block 1005. If instead the low side switch 105L is assessed to be off (exit branch yes of block 1010), n-MOSFET Mpd1 is turned on (block 1015), closing it and making it conductive (phase 5, FIG. 6B). Then, after a delay, p-MOSFET Mpu is turned off (block 1020), opening it and making it not conductive (phase 6, FIG. 6C).

The state of the output terminal LX of the DC-DC converter 100 is then checked, to assess if its voltage level is changing (block 1025). The assessment is made exploiting the signal SINK that carries information about the state of the output terminal LX. If it is assessed that the voltage level at the output terminal LX is not changing (exit branch no of block 1025), meaning that the DC-DC converter 100 is in source mode operation, an immediate turn on of the high side switch 105H is commanded (block 1030): n-MOSFET Mpd2 is turned on (block 1035) making it conductive (FIG. 6D).

If instead it is assessed that the voltage level at the output terminal LX is changing (exit branch yes of block 1025), meaning that the DC-DC converter 100 is in sink mode operation, it is assessed (signal LXH) whether or not the output terminal LX has already reached the high logic state (block 1040). If not (exit branch no of block 1040, signal LXH still low), the circuit of FIG. 7 waits for a watchdog time (block 1045), after which n-MOSFET Mpd2 is turned on (block 1035, signal WD_HS asserted) even if the output terminal LX has already reached the high logic state. If yes (exit branch yes of block 1040, signal LXH high), an immediate turn on of the high side switch 105H is commanded (block 1050) and n-MOSFET Mpd3 is turned on (block 1055) making it conductive. The high side switch 105H is thus activated.

Figure 11:
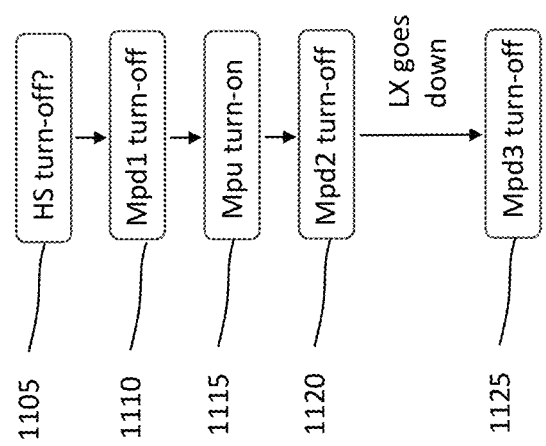
FIG. 11 is a flowchart describing the operation of the circuit of FIG. 7, in the turn-off procedure of the high side switch.

FIG. 11 is a flowchart describing the operation of the circuit of FIG. 7, in the turn-off procedure.

Block 1105 indicates that the circuit of FIG. 7 remains in a wait condition until the receival (from the control logic 115) of the command (signal HS DRIVE deasserted) to turn the high side switch 105H off (making it not conductive). When the high side switch 105H turn off command is received, n-MOSFET Mpd1 is switched off (block 1110, phase 2 of FIG. 5B), then, after a delay, p-MOSFET Mpu is switched on (block 1115, phase 3 of FIG. 5C), then n-MOSFET Mpd2 is switched off (block 1120, phase 4 of FIG. 5D) and, after the voltage at the output terminal LX of the DC-DC converter goes low, n-MOSFET Mpd3 is switched off (block 1125, phase 4 of FIG. 5D).

The operation of the circuit of FIG. 9 is analogous, mutatis mutandis, to that of the circuit of FIG. 7.

Figure 12:
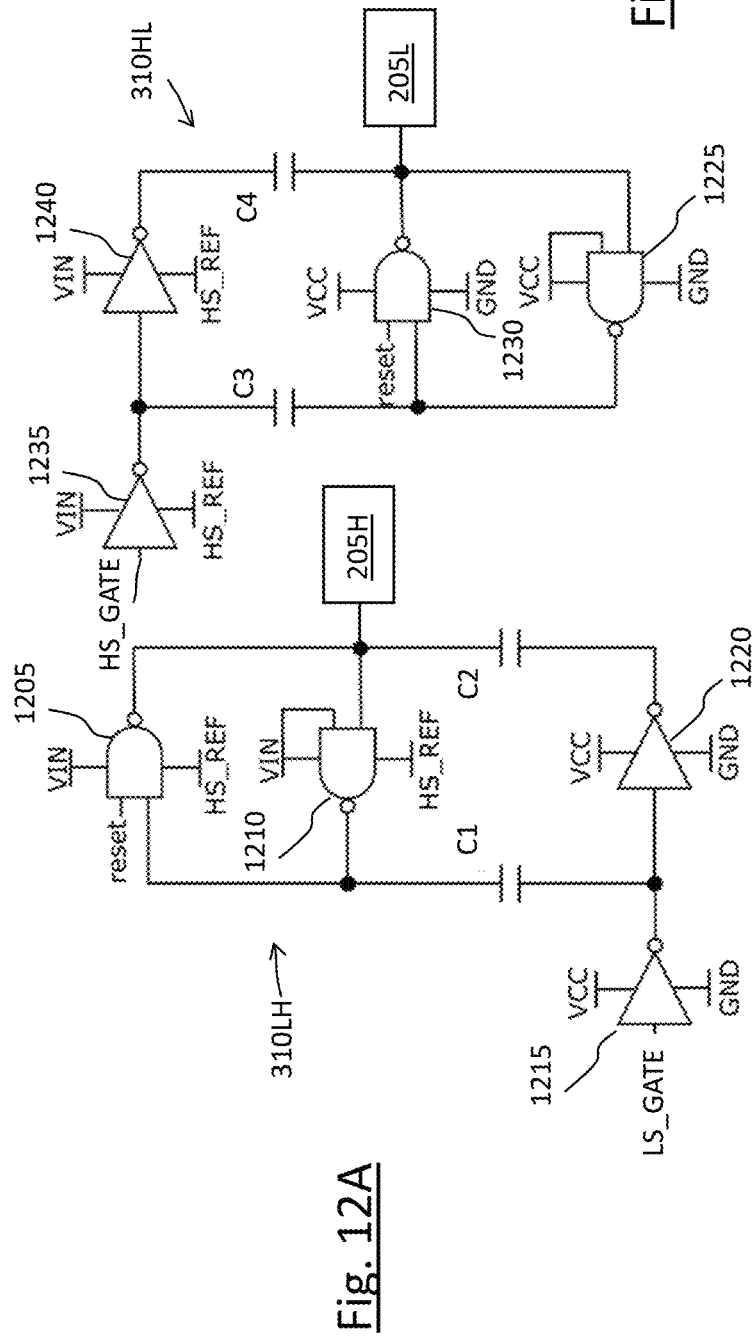
FIGS. 12A and 12B depict possible circuit schemes for capacitive level shifters for the driver of the high side switch and for the driver of the low side switch.

FIGS. 12A and 12B depict possible circuit schemes for capacitive level shifters for the high side driver and for the low side driver. In particular, FIG. 12A depicts a capacitive level shifter 310LH for shifting voltage levels of signals from the domain of the low side logic circuit 205L to the domain of the high side logic circuit 205H. FIG. 12B depicts a capacitive level shifter 310HL for shifting voltage levels of signals from the domain of the high side logic circuit 205H to the domain of the low side logic circuit 205L.

In the shown exemplary embodiment, brute force capacitive level shifters with set-reset latch both for up-to-down and down-to-up circuit.

The level shifter 310LH comprises a bistable latch having two NAND logic gates 1205 and 1210 supplied by the input voltage VIN and the first internal reference voltage HS_REF. Each of the two NAND logic gates 1205 and 1210 has its output terminal coupled to a first input terminal of the other NAND logic gate 1210 and 1205. A second input terminal of NAND logic gate 1210 receives the input voltage VIN. A second input terminal of NAND logic gate 1205 receives a reset signal reset, used at power-on reset of the DC-DC converter 100 for ensuring that the bistable latches set in a predefined condition. The first input terminal of NAND logic gate 1205 is coupled to one plate of a first capacitor C1. The other plate of the first capacitor C1 is coupled to an output terminal of a first inverter 1215 which is supplied by the second internal reference voltage VCC and the reference voltage GND of the DC-DC converter 100, and that receives in input the signal LS_GATE. The first input terminal of NAND logic gate 1210 is coupled to one plate of a second capacitor C2. The other plate of the second capacitor C2 is coupled to an output terminal of a second inverter 1220 which is supplied by the second internal reference voltage VCC and the reference voltage GND of the DC-DC converter 100, and that receives in input the signal outputted by the first inverter 1215. The level-shifted signal fed to the high side logic circuit 205H is taken at the output terminal of NAND logic gate 1205.

The level shifter 310HL comprises a bistable latch having two NAND logic gates 1225 and 1230 supplied by the first internal reference voltage VCC and the reference voltage GND of the DC-DC converter 100. Each of the two NAND logic gates 1225 and 1230 has the output terminal coupled to a first input terminal of the other NAND logic gate 1230 and 1225. A second input terminal of NAND logic gate 1225 receives the first internal reference voltage VCC. A second input terminal of NAND logic gate 1230 receives the reset signal reset. The first input terminal of NAND logic gate 1230 is coupled to one plate of a first capacitor C3. The other plate of the first capacitor C3 is coupled to an output terminal of a first inverter 1235 which is supplied by the input voltage VIN of the DC-DC converter 100 and by the first internal reference voltage HS_REF, and that receives in input the signal HS_GATE. The first input terminal of NAND logic gate 1225 is coupled to one plate of a second capacitor C4. The other plate of the second capacitor C2 is coupled to an output terminal of a second inverter 1240 which is supplied by the input voltage VIN of the DC-DC converter 100 and by the first internal reference voltage HS_REF, and that receives in input the signal outputted by the first inverter 1235. The level-shifted signal fed to the low side logic circuit 205L is taken at the output terminal of NAND logic gate 1230.

The two level shifters 310LH and 310HL transfer the information on the drive signals of the gate electrode of the low side n-MOSFET 105L/high side p-MOSFET 105H to the high side logic circuit 205H/low side logic circuit 205L.

Level shifter 307, for shifting the voltage level of signal DRIVE (driving command) to obtain signal HS_DRV, can be similar to level shifter 310LH.

The level shifters are very fast. Typical switching time of the bistable latches in the two level shifters is of the order of some hundreds of picoseconds.

Figure 13:
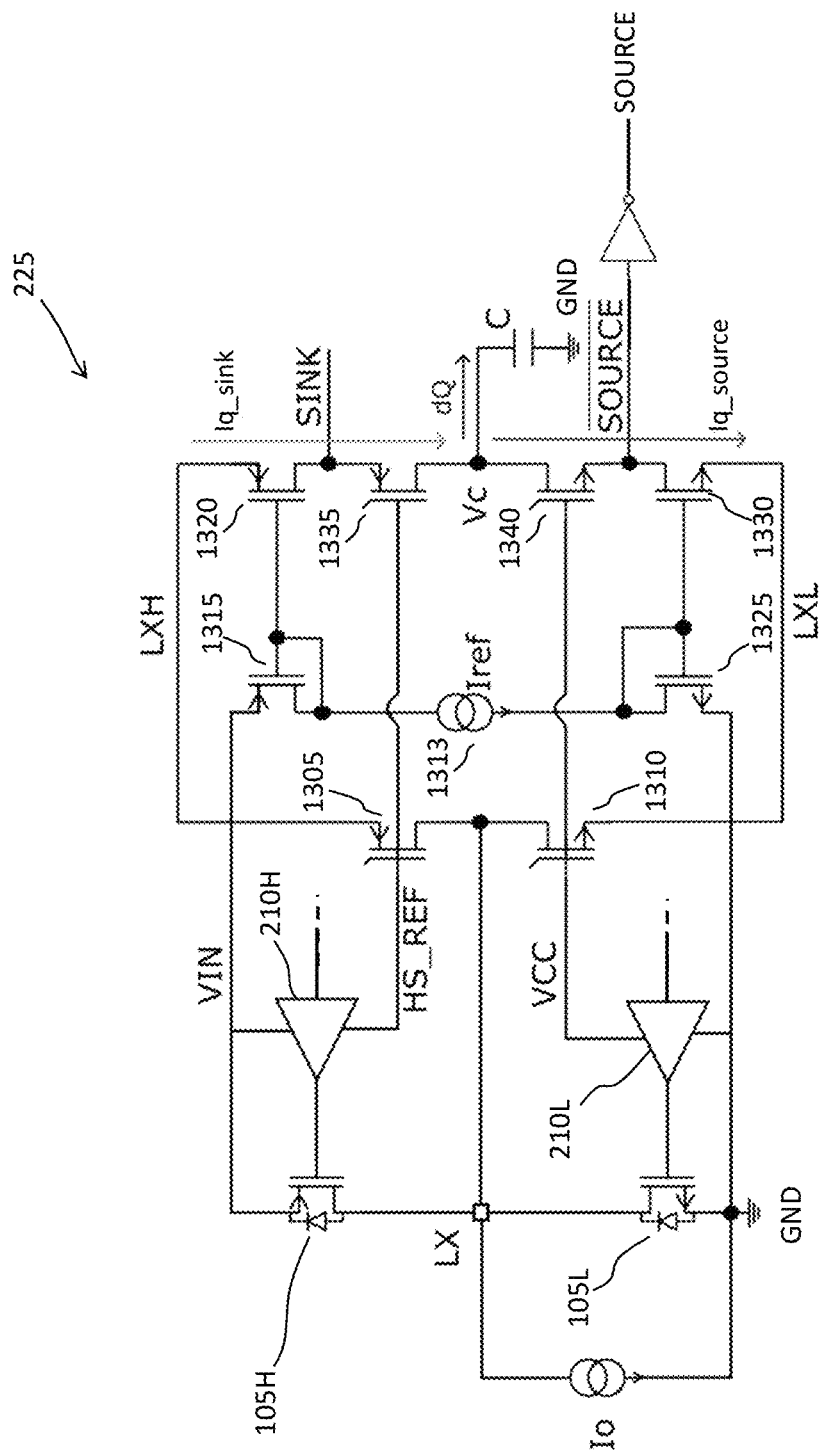
FIG. 13 depicts a possible circuit scheme for a DC-DC converter output current polarity sensing circuit.

FIG. 13 depicts an exemplary circuit schematic for an output current polarity sensing circuit 225. At the left of the figure, there are shown the high side switch (p-MOSFET) 105H and the low side switch (n-MOSFET) 105L, which are coupled to the DC-DC converter output terminal LX, and the respective drivers 210H and 210L. The symbol of current generator denoted with Io is intended to represent the output current of the DC-DC converter 100, which can be either a current delivered by the DC-DC converter 100 to the inductor L of FIG. 1B or a current sunk by the DC-DC converter 100 from the inductor L.

The exemplary current polarity sensing circuit 225 comprises a p-MOSFET 1305 and an n-MOSFET 1310 with drain electrodes coupled to each other and coupled to the output terminal LX of the DC-DC converter 100. The gate electrode of p-MOSFET 1305 receives the first internal reference voltage HS_REF. The gate electrode of n-MOSFET 130 receives the second internal reference voltage VCC. The source electrode of p-MOSFET 1305 is coupled to a line LXH and the source electrode of n-MOSFET 1310 is coupled to a line LXL. The current polarity sensing circuit 225 comprises a reference current Iref generator 1313 coupled to the drain electrode of a p-MOSFET 1315 and to the drain electrode of an n-MOSFET 1325. P-MOSFET 1315 and n-MOSFET 1325 have their drain electrodes coupled to their gate electrodes. The source electrode of p-MOSFET 1315 is coupled to the input voltage VIN. The source electrode of n-MOSFET 1325 is coupled to the reference voltage GND. The gate electrode of p-MOSFET 1315 is coupled to the gate electrode of a p-MOSFET 1320 that has the drain electrode coupled to signal line LXH and source electrode coupled to the drain electrode of a p-MOSFET 1335 that receives at the gate electrode the first internal reference voltage HS_REF. The gate electrode of n-MOSFET 1325 is coupled to the gate electrode of an n-MOSFET 1330 having the source electrode coupled to signal line LXL and the drain electrode coupled to the source electrode of an n-MOSFET 1340 that receives at the gate electrode the second internal reference voltage VCC. The drain electrode of p-MOSFET 1335 and the drain electrode of n-MOSFET 1340 are coupled together, at a node Vc that is coupled to a first plate of a capacitor C whose second plate is conned to the reference voltage GND of the DC-DC converter 100. The common node of p-MOSFETs 1320 and 1335 forms the signal SINK. The common node of n-MOSFETs 1330 and 1340 forms the (logic complement of) the signal SOURCE.

The voltages of lines LXH and LXL are cascoded versions of the voltage at the output terminal LX that contains information about the polarity of the output current Io of the DC-DC converter 100.

The p-MOSFETs 1315 and 1320 form a voltage comparator comparing the input voltage VIN and the voltage of signal LXH. N-MOSFETs 1325 and 1330 form a voltage comparator comparing the reference voltage GND and the voltage of signal LXL.

A charge balance at node Vc at regime provides the information on the polarity of the output current Io of the DC-DC converter 100.

The signals SINK and SOURCE allow the optimization of the transition between switching phases of the high side switch (p-MOSFET) 105H and the low side switch (n-MOSFET) 105L, as discussed in the foregoing.

No further voltage level shifting is required: signals SINK and SOURCE generated by the current polarity sensing circuit 225 can be provided as such to the high side logic circuit 205H and the low side logic circuit 205L.

Duty-cycle and switching frequency of the DC-DC converter 100 therefore only have an impact on the speed of the mechanism.

Figures 14A, 14B:
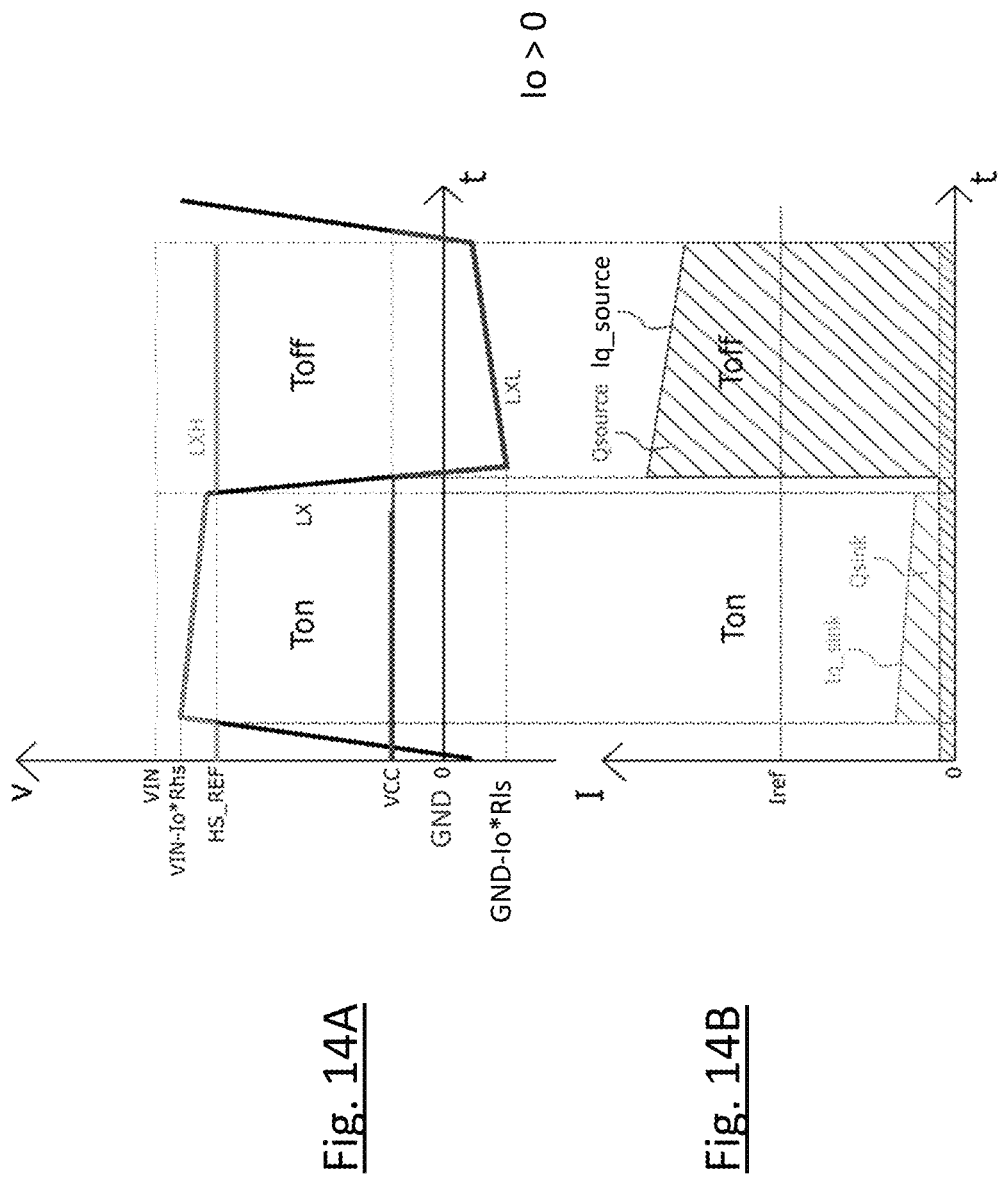
FIGS. 14A and 14B show waveforms of voltage and current of the output current polarity sensing circuit, with the DC-DC converter operating in source condition.

FIGS. 14A and 14B show waveforms of voltage and current in the output current polarity sensing circuit 225 when the DC-DC converter 100 is operating in source mode, i.e., when the DC-DC converter 100 is delivering output current Io to the inductor L in FIG. 1B (Io>0). In particular, FIG. 14A shows the waveforms of the voltage at the output node LX of the DC-DC converter 100 and the voltages of node/lines LXH and LXL of the current polarity sensing circuit 225. FIG. 14B shows the waveforms of current Iq_sink flowing through p-MOSFETs 1320 and 1335 and of current Iq_source flowing through n-MOSFETs 1340 and 1330. The areas subtended by the waveforms Iq_sink and Iq_source represent charge quantities Qsink and Qsource that charge/discharge capacitor C. Ton is the time interval during which the high side switch 105H is turned on (conductive) and the low side switch 105L is turned off (not conductive). Toff is the time interval during which the high side switch 105H is turned off (not conductive) and the low side switch 105L is turned on (conductive). Voltage 0 corresponds to the reference voltage GND of the DC-DC converter 100. Rhs indicates the on resistance of the high side switch 105H, Rls indicates the on resistance of the low side switch 105L. Iref is the value of the reference current generated by reference current generator 1313.

As visible in FIG. 14A, in source mode operation the voltage at node/line LXH follows the voltage at the output terminal LX during time interval Ton (rising to VIN−Io*Rhs and then falling towards the first internal reference voltage HS_REF). During time interval Toff, the voltage at node/line LXH remains at the first internal reference voltage HS_REF. The voltage at node/line LXL, during time interval Ton, remains at the second internal reference voltage VCC. During time interval Toff, the voltage at node/line LXL follows the voltage at the output terminal LX, firstly dropping to GND−Io*Rls and then rising towards the reference voltage GND.

As visible in FIG. 14B, in source mode operation of the DC-DC converter 100 condition Q_source>Q_sink, therefore the (logic complement of) signal SOURCE and the signal SINK go to a logic '0' (thereby the signal SOURCE goes to a logic '1') since the charge balance at node Vc node is negative. As described in the foregoing, the signal SOURCE is used to enable the watchdog time for the low side switch 105L: if the output current Io of the DC-DC converter 100 is positive (source mode operation, signal SOURCE='1') the system goes in "soft-switching mode", otherwise (in sink mode operation, signal SOURCE='0' and output current Io markedly positive, or when the output current Io is very low or almost zero) the low side switch 105L is turned on right after the turning off of the high side switch 105H, to avoid the intrinsic diode of the high side p-MOSFET 105H entering into conduction.

Figures 15A, 15B:
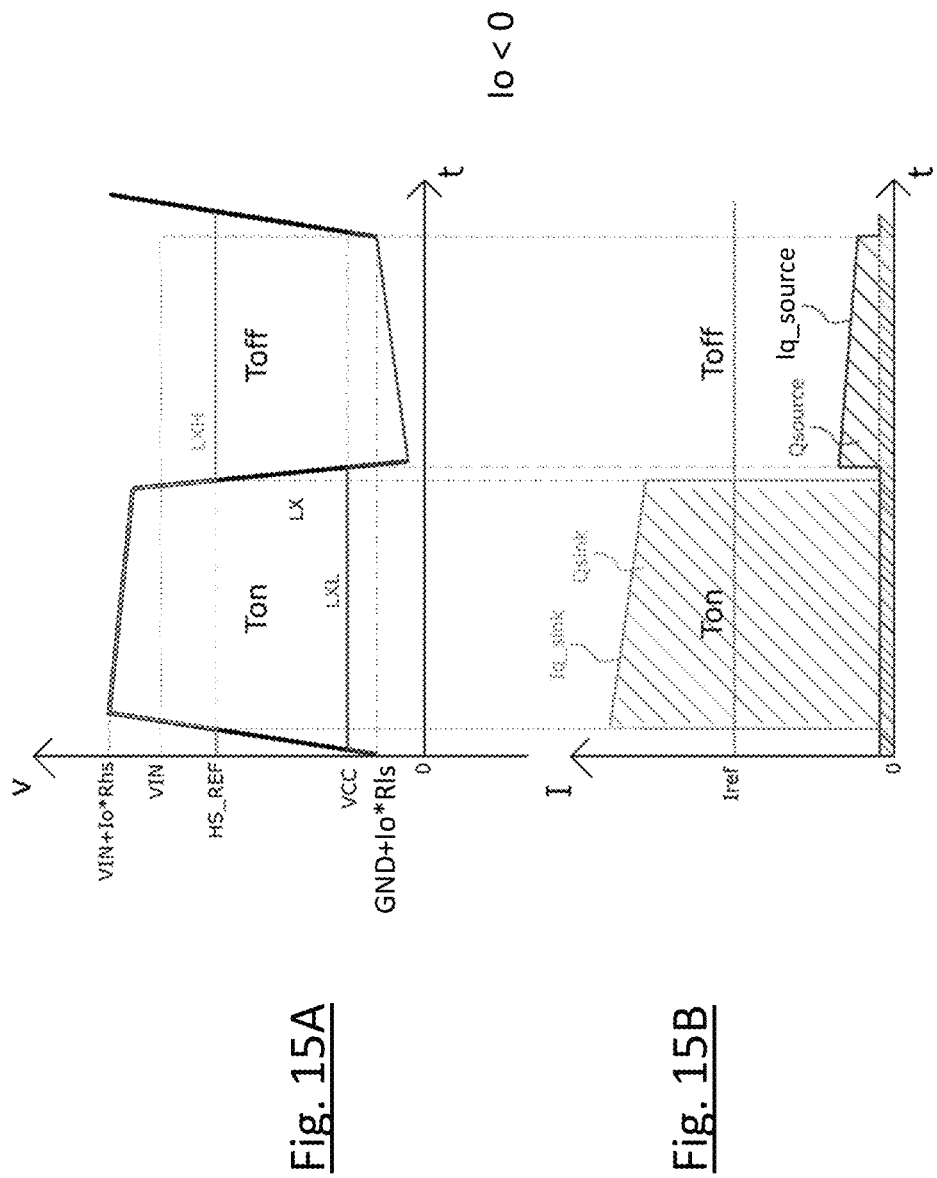
FIGS. 15A and 15B show waveforms of voltage and current of the output current polarity sensing circuit, with the DC-DC converter operating in sink condition.

FIGS. 15A and 15B show waveforms of voltage and current in the output current polarity sensing circuit 225 when the DC-DC converter 100 is operating in sink mode, i.e., when the DC-DC converter 100 is sinking current Io from the inductor L of FIG. 1B. In particular, FIG. 15A shows the waveforms of the voltage at the output node LX of the DC-DC converter 100 and the voltages of node/lines LXH and LXL of the current polarity sensing circuit 225. FIG. 15B shows the waveforms of current Iq_sink flowing through p-MOSFETs 1320 and 1335 and of current Iq_source flowing through n-MOSFETs 1340 and 1330.

In sink condition Q_source<Q_sink, therefore the (logic complement of) signal SOURCE and the signal SINK go to a logic '1' since the charge balance at node Vc is positive. As described in the foregoing, the signal SINK is used to enable watchdog time for the high side switch 105H: if the output current Io of the DC-DC converter 100 is negative (DC-DC converter 100 operating in sink mode) the system allows the voltage at the output terminal LX to rise under output current control, otherwise (if signal SINK='0') the high side switch 105H is turned on right after the turning off of the low side switch, to avoid the intrinsic diode of the low side n-MOSFET 105L entering into conduction.

FIGS. 16A and 16B show possible circuit implementations of the watchdog management for the high side switch 105H and low side switch 105L, respectively.

Starting with FIG. 16A, the high side watchdog circuit 1600A for the high side switch 105H comprises a CMOS inverter 1605, 1610 receiving a reference current Iref generated by a current generator 1615. The current generator 1615 is supplied by the input voltage VIN of the DC-DC converter 100. The source electrode of the n-MOSFET 1610 of the CMOS inverter 1605, 1610 is coupled to a line supplying the first internal reference voltage HS_REF. Preferably, the current generator 1615 is a variable current generator, allowing an adjustment of the value of the generated reference current Iref. The input of the CMOS inverter 1605, 1610 receives a logic complement (inverter 1633) of the signal HS_DRV that controls the high side driver 210H of the high side switch 105H. A capacitor C is coupled to the output terminal of the CMOS inverter 1605, 1610 and to the line supplying the first internal reference voltage HS_REF, in shunt to the n-MOSFET 1610. A voltage comparator 1620 with threshold voltage VTH has the input coupled to the output terminal of the CMOS inverter 1605, 1610 and feeds a logic signal HS_DRV_DEL to a first input of a first AND logic gate 1625, whose second input is fed with the signal SINK. A logic complement of the signal SINK is fed to a first input of a second AND gate 1630 whose second input receives the signal HS_DRV. The outputs of the first and second AND logic gates 1625 and 1630 are respectively fed to a first and a second input of an OR logic gate 1635, generating the watchdog signal WD_HS for the high side driver of the high side switch 105H.

The low side watchdog circuit 1600B for the low side switch 105L, shown in FIG. 16B, has essentially the same topology as the watchdog circuit for the high side switch 105H (same reference numerals are used to denote identical components), with the following differences: signal LS_DRV that controls the driver of the low side switch 105L, instead of the signal HS_DRV; second internal reference voltage VCC instead of the input voltage VIN of the DC-DC converter 100; reference voltage GND of the DC-DC converter 100 instead of the first internal reference voltage HS_REF; signal SOURCE instead of the signal SINK, and NOR logic gate 1635 instead of OR logic gate. The signal WD_LS generated by the watchdog circuit of FIG. 16B is the watchdog signal for the low side driver of the low side switch 105H.

In the high side watchdog circuit 1600A, when the signal HS_DRV is deasserted ("low" logic state), n-MOSFET 1610 is on, thereby causing capacitor C to be discharged. Signal HS_DRV_DEL, which is a delayed version of signal HS_DRV, is deasserted ("low" logic state).

When the signal HS_DRV is asserted (switch from "low" logic state to "high" logic state), p-MOSFET 1605 is turned on, thereby causing capacitor C to be charged by the reference current Iref generated by reference current generator 1615. When, in consequence of the charging, the voltage across capacitor C crosses the threshold voltage Vth of voltage comparator 1620, the output signal HS_DRV_DEL switches to the "high" logic state (with a delay compared to the switching of signal HS_DRV).

In both the high side and low side watchdog circuits 1600A and 1600B, changing the value of the reference current Iref changes the watchdog time, according to the following formula:

$$WD\_time = (Vth * C)/Iref$$

The signals SINK and SOURCE act as enable signals, respectively, for the respective watchdog circuit.

Figure 17:
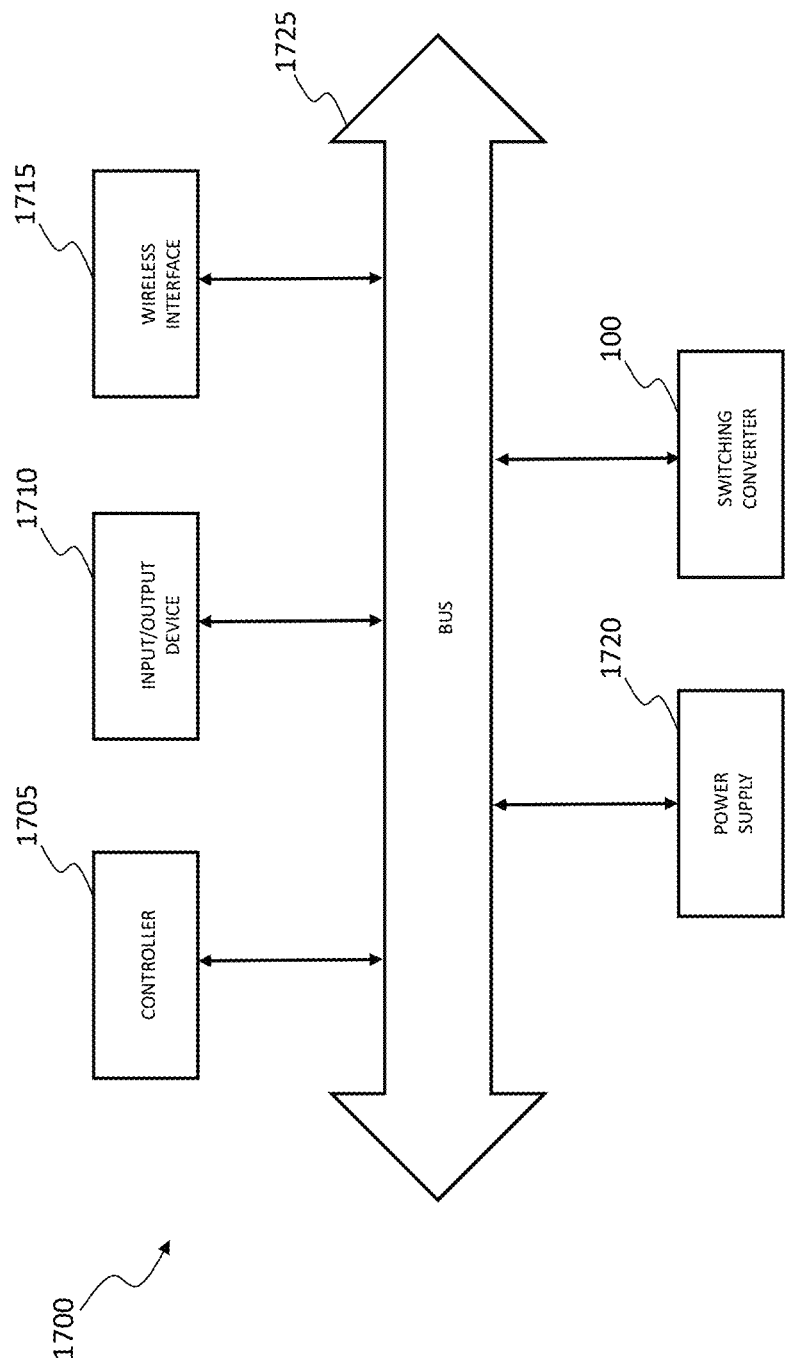
FIG. 17 shows a simplified block diagram of an electronic system comprising the DC-DC converter of FIG. 1 according to an embodiment disclosed herein.

FIG. 17 shows a simplified block diagram of an electronic system 1700 (i.e., a portion thereof) comprising the DC-DC converter 100 (or more thereof) according to an embodiment.

According to an embodiment, the electronic system 1700 is suitable for use in any electronic apparatus.

According to an embodiment, the electronic system 1700 comprises a controller 1705 (for example, one or more microprocessors and/or one or more microcontrollers).

According to an embodiment, the electronic system 1700 comprises an input/output device 1710 (for example, a keyboard and/or a screen). The input/output device 1710 may for example be used to generate and/or receive messages. The input/output device 1710 may for example be configured to receive/supply a digital signal and/or an analog signal.

According to an embodiment, the electronic system 1700 comprises a wireless interface 1715 for exchanging messages with a wireless communication network (not shown), for example using radio frequency signals. Examples of a wireless interface may include antennas and wireless transceivers.

According to an embodiment, the electronic system 1700 comprises a power supply device (for example, a battery) 1720 for powering the electronic system 1700.

According to an embodiment, the electronic system 1700 comprises one or more communication channels (bus) 1725 to allow the exchange of data between the switching converter 100, the controller 1705 (when provided), the input/output device 1710 (when provided), the wireless interface 1715 (when provided), and the power supply device 1720 (when provided).

The exemplary embodiments presented in the present description are not to be intended as limitative. Other embodiments are possible without departing from the scope of the appended claims.

The invention claimed is:

1. A DC-DC switching converter, comprising:
   power switches operable to selectively couple an output terminal of the DC-DC switching converter to a first voltage or a second voltage, the output terminal being coupleable to a load when the DC-DC switching converter is in use;
   wherein the power switches comprise a first power switch operable for selectively coupling an output terminal of the DC-DC switching converter to the first voltage, and a second power switch operable for selectively coupling the output terminal of the DC-DC switching converter to the second voltage;
   a driver stage coupled to the power switches and configured to drive the power switches;
   wherein the driver stage comprises: a first driver stage coupled to and configured to control the first power switch; and a second driver stage coupled to and configured to control the first power switch;
   wherein the first driver stage comprises a first switch, a second switch, and a third switch in series between the first voltage and a first internal reference voltage of the DC-DC switching converter configured to cause activation of the first power switch when applied thereto, wherein the first switch is controlled by a first drive command generated by a control logic of the DC-DC switching converter, the second switch is controlled by a first activation command for the activation of the first driver stage and by a first signal indicative of a voltage level at the output terminal of the DC-DC switching converter, and the third switch is controlled by a first switch control signal depending on the first drive command and on a signal indicative of an activation state of the second power switch;

wherein the second driver stage comprises a fourth switch, a fifth switch and a sixth switch in series between the second voltage and a second internal reference voltage of the DC-DC switching converter configured to cause the activation of the second power switch when applied thereto, wherein the fourth switch is controlled by a second drive command generated by a control logic of the DC-DC switching converter, the fifth switch is controlled by a second activation command for the activation of the second driver stage and by a second signal indicative of the voltage level at the output terminal of the DC-DC switching converter, and the sixth switch is controlled by a second switch control signal depending on the second drive command and on a signal indicative of an activation state of the first power switch;

a driver control stage coupled to the driver stage and configured to control the operation of the driver stage;

wherein the driver control stage comprises:

first driver control stage coupled to and configured to control the operation of the first driver stage, wherein the first driver control stage is further configured to delay the first activation command for activation of the first driver stage when a first control signal is asserted, to receive the signal indicative of an activation state of the second power switch, and to enable the activation of the first power switch by the first driver stage if the signal indicative of the activation state of the second power switch indicates that the second power switch is de-activated; and a second driver control stage coupled to and configured to control the operation of the second driver stage, wherein the second driver control stage is further configured to delay the second activation command for activation of the second driver stage when a second control signal is asserted, to receive the signal indicative of an activation state of the first power switch, and to enable the activation of the second power switch by the second driver stage if the signal indicative of an activation state of the first power switch indicates that the first power switch is de-activated; and an output current sensing circuit coupled to the output terminal of the DC-DC switching converter and to the first and second driver control stages, the output current sensing circuit configured to sense a sign of an output current delivered by the DC-DC switching converter at the output terminal when in operation;

wherein the output current sensing circuit generates and feeds the first control signal to the first driver control stage, the first control signal being asserted when, during operation, the sensed sign of the output current delivered by the DC-DC switching converter at the output terminal is negative and the DC-DC switching converter is sinking current from the load;

wherein the output current sensing circuit generates and feeds the second control signal to the second driver control stage, the second control signal being asserted when, during operation, the sensed sign of the output current delivered by the DC-DC switching converter at the output terminal is positive and the DC-DC switching converter is sourcing current to the load;

wherein the first and second driver control stages control the operation of the first and second driver stages according to states of the first and second control signals to selectively delay activation of the first and second power switches depending on the sensed sign of the output current.

2. An electronic system, comprising at least one DC-DC converter according to claim 1.

3. The DC-DC switching converter of claim 1, wherein the first power switch comprises a p-channel transistor having its source connected to the first voltage, its drain connected to the output terminal of the DC-DC switching converter, and a gate connected to a first control node; and wherein the second power switch comprises an n-channel transistor having its drain connected to the output terminal of the DC-DC switching converter, its source connected to the second voltage, and its gate connected to a second control node.

4. The DC-DC switching converter of claim 3, wherein the first driver stage includes:

a p-channel transistor having its source connected to the first voltage, its drain connected to the first control node, and its gate coupled to be controlled by the first drive command;

a first n-channel transistor having its drain connected to the first control node, its source connected to a first node, and its gate coupled to receive the first activation command; and a second n-channel transistor having its drain connected to the first node, its source connected to the first internal reference voltage, and its gate coupled to receive the first switch control signal.

5. The DC-DC switching converter of claim 4, wherein the second driver stage includes:

an n-channel transistor having its source connected to the second voltage, its drain connected to the second control node, and its gate coupled to be controlled by the second drive command;

a first p-channel transistor having its drain connected to the second control node, its source connected to a second node, and its gate coupled to receive the second activation command; and a second p-channel transistor having its drain connected to the second node, its source connected to the second internal reference voltage, and its gate coupled to the second switch control signal.

6. A method of operating a DC-DC switching converter having power switches operable to selectively coupling an output terminal of the DC-DC switching converter to a first voltage or with a second voltage, wherein the power switches comprise a first power switch operable for selectively coupling the output terminal of the DC-DC switching converter with the first voltage, and a second power switch operable for selectively coupling the output terminal of the DC-DC switching converter with the second voltage, the method comprising:

sensing a sign of an output current of the DC-DC switching converter, said output current being delivered by the DC-DC switching converter to a load;

assessing a voltage level at the output terminal of the DC-DC switching converter; and selectively delaying activation of the first and second power switches depending on the sensed sign of the output current by conditioning the delaying the activation of the first and second power switches depending on the assessed voltage level at the output terminal;
wherein the conditioning of the delaying of the activation of the first and second power switches comprises:
   delaying activation of the first power switch in case the DC-DC switching converter is operating in sink mode, sinking current from the load, and the voltage level at the output terminal has not yet risen towards the first voltage; and
   delaying activation of the second power switch in case the DC-DC switching converter is operating in source mode, supplying current to the load, and the voltage at the output terminal has not yet fallen toward the second voltage.

7. A DC-DC switching converter, comprising:
a first power switch operable to selectively couple an output terminal of the DC-DC switching converter to a first voltage, and a second power switch operable to selectively couple the output terminal to a second voltage;
a first driver stage coupled to and configured to control the first power switch, and a second driver stage coupled to and configured to control the second power switch;
wherein the first driver stage comprises a first switch, a second switch, and a third switch coupled in series between the first voltage and a first internal reference voltage, wherein the first switch is controlled by a drive command, the second switch is controlled by an activation command for the first driver stage and by a first signal indicative of a voltage level at the output terminal of the DC-DC switching converter, and the third switch is controlled by a switch control signal depending on the drive command and a signal indicative of an activation state of the second power switch;
a first driver control stage coupled to and configured to control the operation of the first driver stage, and a second driver control stage coupled to and configured to control the operation of the second driver stage, wherein the first driver control stage is configured to delay the activation command for the first driver stage when a first control signal is asserted; and
an output current sensing circuit coupled to the output terminal of the DC-DC switching converter, the output current sensing circuit configured to:
   sense a sign of an output current delivered by the DC-DC switching converter at the output terminal when in operation, and to generate control signals for the first and second driver control stages; and
   generate and feed the first control signal to the first driver control stage, the first control signal being asserted when, during operation, the sensed sign of the output current delivered by the DC-DC switching converter at the output terminal is negative and the DC-DC switching converter is sinking current from a load.

8. The DC-DC switching converter of claim 7, wherein the second driver control stage is configured to delay an activation command for activation of the second driver stage when a second control signal is asserted.

9. The DC-DC switching converter of claim 8, wherein the output current sensing circuit is further configured to generate and feed the second control signal to the second driver control stage, the second control signal being asserted when, during operation, the sensed sign of the output current delivered by the DC-DC switching converter at the output terminal is positive and the DC-DC switching converter is sourcing current to the load.

10. The DC-DC switching converter of claim 9, wherein the second driver stage comprises a fourth switch, a fifth switch and a sixth switch coupled in series between the second voltage and a second internal reference voltage, wherein the fourth switch is controlled by the drive command, the fifth switch is controlled by an activation command for the second driver stage and by a second signal indicative of a voltage level at the output terminal of the DC-DC switching converter, and the sixth switch is controlled by a switch control signal depending on the drive command and the signal indicative of an activation state of the second power switch.

11. A DC-DC switching converter, comprising:
power switches operable to selectively couple an output terminal of the DC-DC switching converter to a first voltage or a second voltage, the output terminal being coupleable to a load when the DC-DC switching converter is in use;
a driver stage coupled to the power switches and configured to drive the power switches;
a driver control stage coupled to the driver stage and configured to control the operation of the driver stage; and
an output current sensing circuit coupled to the output terminal of the DC-DC switching converter and to the driver control stage, the output current sensing circuit configured to sense a sign of an output current delivered by the DC-DC switching converter at the output terminal when in operation and to generate control signals for the driver control stage;
wherein the driver control stage controls the operation of the driver stage according to states of the control signals received from the output current sensing circuit to selectively delay activation of the power switches depending on the sensed sign of the output current;
wherein the power switches comprise:
   a first power switch operable for selectively coupling the output terminal of the DC-DC switching converter to the first voltage; and
   a second power switch operable for selectively coupling the output terminal of the DC-DC switching converter to the second voltage;
wherein the driver stage comprises:
   a first driver stage coupled to and configured to control the first power switch; and
   a second driver stage coupled to and configured to control the first power switch;
wherein the first driver stage comprises:
   a first switch, a second switch, and a third switch in series between the first voltage and a first internal reference voltage of the DC-DC switching converter configured to cause the activation of the first power switch when applied thereto;
   wherein the first switch is controlled by a first drive command fed to the driver control stage;
   wherein the second switch is controlled by a first activation command for the activation of the first driver stage and by a first signal indicative of a voltage level at the output terminal of the DC-DC switching converter; and
   wherein the third switch is controlled by a first switch control signal depending on the first drive command and on a signal indicative of an activation state of the second power switch;
wherein the second driver stage comprises:
   a fourth switch, a fifth switch and a sixth switch in series between the second voltage and a second internal reference voltage of the DC-DC switching converter configured to cause the activation of the second power switch when applied thereto;

wherein the fourth switch is controlled by a second drive command fed to the driver control stage;

wherein the fifth switch is controlled by a second activation command for the activation of the second driver stage and by a second signal indicative of a voltage level at the output terminal of the DC-DC switching converter; and wherein the sixth switch is controlled by a second switch control signal depending on the second drive command and on the signal indicative of an activation state of the second power switch.

12. The DC-DC switching converter of claim 11, wherein the first power switch comprises a p-channel transistor having its source connected to the first voltage, its drain connected to the output terminal of the DC-DC switching converter, and a gate connected to a first control node; and wherein the second power switch comprises an n-channel transistor having its drain connected to the output terminal of the DC-DC switching converter, its source connected to the second voltage, and its gate connected to a second control node.

13. The DC-DC switching converter of claim 12, wherein the first driver stage includes:

a p-channel transistor having its source connected to the first voltage, its drain connected to the first control node, and its gate coupled to be controlled by the first drive command;

a first n-channel transistor having its drain connected to the first control node, its source connected to a first node, and its gate coupled to receive the first activation command; and a second n-channel transistor having its drain connected to the first node, its source connected to the first internal reference voltage, and its gate coupled to receive the first switch control signal.

14. The DC-DC switching converter of claim 13, wherein the second driver stage includes:

an n-channel transistor having its source connected to the second voltage, its drain connected to the second control node, and its gate coupled to be controlled by the second drive command;

a first p-channel transistor having its drain connected to the second control node, its source connected to a second node, and its gate coupled to receive the second activation command; and a second p-channel transistor having its drain connected to the second node, its source connected to the second internal reference voltage, and its gate coupled to the second switch control signal.

* * * * *